United States Patent
Hwang et al.

(10) Patent No.: US 9,673,366 B2
(45) Date of Patent: Jun. 6, 2017

(54) LIGHT EMITTING DEVICE AND LIGHT EMITTING APPARATUS

(71) Applicant: LG INNOTEK CO., LTD., Seoul (KR)

(72) Inventors: Deok Ki Hwang, Seoul (KR); Young Ju Han, Seoul (KR); Hee Seok Choi, Seoul (KR); Ju Won Lee, Seoul (KR); Pil Geun Kang, Seoul (KR); Seok Beom Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/925,251

(22) Filed: Oct. 28, 2015

(65) Prior Publication Data

US 2016/0049546 A1 Feb. 18, 2016

Related U.S. Application Data

(63) Continuation of application No. 13/293,858, filed on Nov. 10, 2011.

(30) Foreign Application Priority Data

May 27, 2011 (KR) .......................... 10-2011-0050903
May 27, 2011 (KR) .......................... 10-2011-0050904

(51) Int. Cl.
*H01L 33/06* (2010.01)
*H01L 33/62* (2010.01)
(Continued)

(52) U.S. Cl.
CPC .............. *H01L 33/62* (2013.01); *H01L 33/06* (2013.01); *H01L 33/32* (2013.01); *H01L 33/385* (2013.01);
(Continued)

(58) Field of Classification Search
CPC ......... H01L 33/62; H01L 33/54; H01L 33/46; H01L 33/507; H01L 33/06; H01L 33/32;
(Continued)

(56) References Cited

U.S. PATENT DOCUMENTS 5,012,969 A 5/1991 Hatada et al.
7,589,351 B2 * 9/2009 Hsieh ..................... H01L 33/38
257/100

(Continued)

FOREIGN PATENT DOCUMENTS

CN 1780001 A 5/2006
CN 101027795 A 8/2007
(Continued)

OTHER PUBLICATIONS

Korean Office Action dated Jun. 29, 2012 for Application No. 10-2011-0050904.
(Continued)

*Primary Examiner* — Latanya N Crawford
(74) *Attorney, Agent, or Firm* — KED & Associates LLP

(57) ABSTRACT

A light emitting device may be provided that includes a substrate, a light emitting structure, a first electrode on a part of the first semiconductor layer, an electrode layer on the second conductive semiconductor layer, an insulating layer on the electrode layer, a second electrode on the electrode layer, a support member on the insulating layer, a first connection electrode connected to the first electrode, and a second connection electrode connected to the second electrode. The insulating layer is disposed on a side surface of the light emitting structure and the part of the first semiconductor layer. The insulating layer includes a first layer and a second layer having a different material from the first layer. The first layer of the insulating layer has a refractive index different from the second layer of the insulating layer.

20 Claims, 22 Drawing Sheets

(51) Int. Cl.
  *H01L 33/38* (2010.01)
  *H01L 33/40* (2010.01)
  *H01L 33/32* (2010.01)
  *H01L 33/46* (2010.01)
  *H01L 33/48* (2010.01)
  *H01L 33/64* (2010.01)
  *H01L 33/00* (2010.01)
  *H01L 33/44* (2010.01)
  *H01L 33/50* (2010.01)

(52) U.S. Cl.
  CPC ............ *H01L 33/405* (2013.01); *H01L 33/46* (2013.01); *H01L 33/483* (2013.01); *H01L 33/507* (2013.01); *H01L 33/641* (2013.01); *H01L 33/0079* (2013.01); *H01L 33/44* (2013.01); *H01L 33/505* (2013.01); *H01L 2224/16* (2013.01)

(58) Field of Classification Search
  CPC ... H01L 33/483; H01L 33/641; H01L 33/385; H01L 33/405; H01L 2224/16; H01L 33/44; H01L 33/505; H01L 33/0079
  See application file for complete search history.

(56) References Cited

U.S. PATENT DOCUMENTS

| | | | |
|---|---|---|---|
| 7,737,460 | B2 | 6/2010 | Fujimoto et al. |
| 8,444,882 | B2 | 5/2013 | Kanisawa et al. |
| 8,541,801 | B2* | 9/2013 | Kim .................. H01L 33/56 257/98 |
| 8,552,447 | B2 | 10/2013 | Yahata et al. |
| 8,791,494 | B2 | 7/2014 | Jeong et al. |
| 9,105,814 | B2* | 8/2015 | Hwan ................ H01L 33/382 |
| 2002/0081773 | A1 | 6/2002 | Inoue et al. |
| 2003/0010986 | A1 | 1/2003 | Lin et al. |
| 2006/0006401 | A1 | 1/2006 | Chen |
| 2007/0126016 | A1* | 6/2007 | Chen ................ H01L 33/0079 257/96 |
| 2007/0182323 | A1 | 8/2007 | Ogata et al. |
| 2007/0262338 | A1 | 11/2007 | Higashi et al. |
| 2007/0267650 | A1* | 11/2007 | Hsieh ................ H01L 33/38 257/99 |
| 2009/0065790 | A1 | 3/2009 | Chitnis et al. |
| 2009/0283787 | A1 | 11/2009 | Donofrio et al. |
| 2010/0012963 | A1 | 1/2010 | Hwan |
| 2010/0052003 | A1 | 3/2010 | Shum |
| 2010/0109025 | A1 | 5/2010 | Bhat |
| 2010/0148198 | A1* | 6/2010 | Sugizaki ............ H01L 33/44 257/98 |
| 2010/0230711 | A1 | 9/2010 | Kuo et al. |
| 2010/0264438 | A1* | 10/2010 | Suenaga ............ H01L 33/58 257/98 |
| 2010/0301349 | A1* | 12/2010 | Wang ................ H01L 23/544 257/76 |
| 2010/0320479 | A1* | 12/2010 | Minato .............. H01L 33/505 257/88 |
| 2011/0114978 | A1 | 5/2011 | Kojima et al. |
| 2011/0284822 | A1* | 11/2011 | Jung ................. H01L 33/505 257/13 |
| 2011/0291143 | A1* | 12/2011 | Kim .................. H01L 33/56 257/98 |
| 2012/0097972 | A1* | 4/2012 | Sugizaki ............ H01L 33/44 257/76 |
| 2013/0026518 | A1 | 1/2013 | Suh et al. |
| 2013/0119424 | A1 | 5/2013 | Kang et al. |

FOREIGN PATENT DOCUMENTS

| | | | |
|---|---|---|---|
| EP | 2 216 834 A1 | 8/2010 | |
| EP | 2 325 906 A1 | 5/2011 | |
| JP | 2001-230448 A | 8/2001 | |
| JP | 2003-007929 A | 1/2003 | |
| JP | 2006-114820 A | 4/2006 | |
| JP | 2006-222288 A | 8/2006 | |
| KR | 10-0652133 B1 | 11/2006 | |
| KR | 10-2009-0057382 A | 6/2009 | |
| KR | 10-2009-0115156 A | 11/2009 | |
| WO | WO 2010-077082 A2 | 7/2010 | |
| WO | WO 2010077082 A3 * | 10/2010 | ............ H01L 33/56 |

OTHER PUBLICATIONS

Korean Notice of Allowance dated Oct. 26, 2012 for Application No. 10-2011-0050903.
U.S. Office Action dated Jan. 30, 2014 issued in U.S. Appl. No. 13/293,858.
Chinese Office Action dated Jun. 5, 2014 issued in Application No. 201210138022.5 (Chinese Full Text).
U.S. Office Action dated Aug. 29, 2014 issued in U.S. Appl. No. 13/293,858.
U.S. Office Action dated Jan. 5, 2015 issued in U.S. Appl. No. 13/293,858.
Chinese Office Action issued in Application No. 201210138022.5 dated Jan. 15, 2015.
U.S. Notice of Allowance dated Jul. 29, 2015 issued in U.S. Appl. No. 13/293,858.
European Search Report issued in Application No. 12156094.0 dated Oct. 15, 2015.

* cited by examiner

LIGHT EMITTING DEVICE AND LIGHT EMITTING APPARATUS

CROSS-REFERENCE TO RELATED APPLICATIONS

The present application is a Continuation of co-pending U.S. patent application Ser. No. 13/293,858 filed on Nov. 10, 2011, which claims priority under 35 U.S.C. §119(a) from Korean Patent Application Nos. 10-2011-0050903, filed May 27, 2011 and 10-2011-0050904, filed May 27, 2011, the subject matters of which are hereby incorporated by reference.

BACKGROUND

1. Field

An embodiment may relate to a light emitting device and/or a light emitting apparatus.

2. Background

Groups III-V nitride semiconductors may be used as main materials for light emitting devices, such as a light emitting diode (LED) or a laser diode (LD), due to physical and chemical characteristics thereof. The groups III-V nitride semiconductors may include a semiconductor material having a compositional formula of $In_xAl_yGa_{1-x-y}N$ ($0 \le x \le 1$, $0 \le y \le 1$, and $0 \le x+y \le 1$).

The LED is a semiconductor device that transmits/receives signals by converting an electric signal into infrared ray or light using characteristics of compound semiconductors. The LED may also be used as a light source.

The LED or the LD using the nitride semiconductor material may be used for the light emitting device to provide the light. For example, the LED or the LD may be used as a light source for various products, such as a keypad light emitting part of a cellular phone (or mobile terminal), an electric signboard, and/or a lighting device.

BRIEF DESCRIPTION OF THE DRAWINGS

Arrangements and/or embodiments may be described in detail with reference to the following drawings in which like reference numerals refer to like elements and wherein.

DETAILED DESCRIPTION

Figure 1:
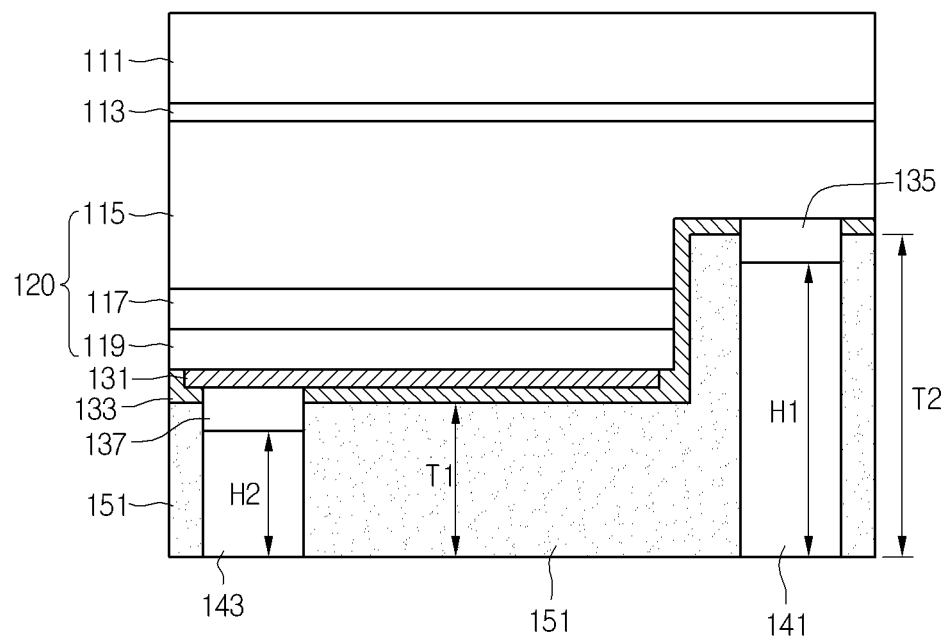
FIG. 1 is a side sectional view of a light emitting device according to a first embodiment.

It may be understood that, when a layer (or film), a region, a pattern, or a structure is referred to as being "on" or "under" another substrate, another layer (or film), another region, another pad, or another pattern, it may be "directly" or "indirectly" on the other substrate, layer (or film), region, pad, or pattern, and/or one or more intervening layers may also be present. A position of the layer may be described with reference to the drawings.

A thickness and a size of each layer (shown in the drawings) may be exaggerated, omitted and/or schematically drawn for ease of convenience or clarity. Additionally, the size of elements may not utterly reflect an actual size.

Embodiments may be described with reference to accompanying drawings.

Figure 2:
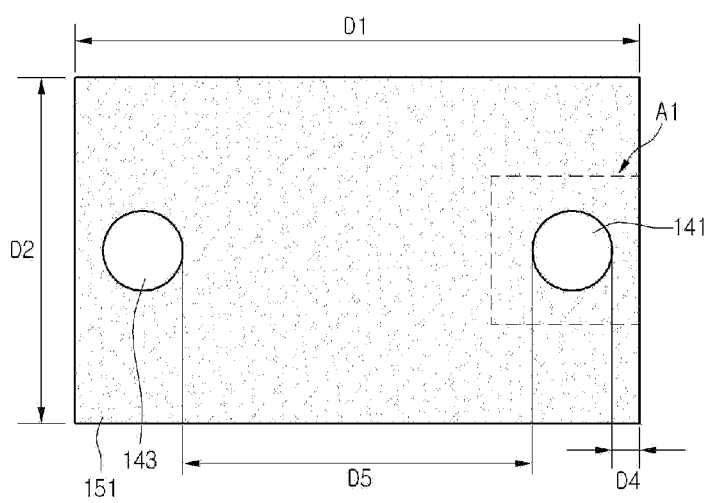
FIG. 2 is a bottom view of the light emitting device shown in FIG. 1.

FIG. 1 is a side sectional view of a light emitting device according to a first embodiment. FIG. 2 is a bottom view of the light emitting device shown in FIG. 1. Other embodiments and configurations may also be provided.

Referring to FIGS. 1 and 2, a light emitting device 100 may include a substrate 111, a first semiconductor layer 113, a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143, and a support member 151.

The substrate 111 may include a transmissive substrate, an insulating substrate and/or a conductive substrate. For example, the substrate 111 may include at least one of $Al_2O_3$, SiC, Si, GaAs, GaN, ZnO, Si, GaP, InP, Ge and/or $Ga_2O_3$. A light extracting structure, such as a concavo-convex pattern, may be formed on one lateral side of the substrate 111. The concavo-convex pattern may be formed by etching the substrate or forming a roughness on the substrate. The concavo-convex pattern may have a stripe shape or a convex lens shape.

The first semiconductor layer 113 may be formed under the substrate 111. The first semiconductor layer 113 may include a group II to VI compound semiconductor. The first semiconductor layer 113 can be formed as a single layer or multiple layers by using the group II to VI compound semiconductor. For example, the first semiconductor layer 113 may include a group III-V compound semiconductor including at least one of GaN, InN, AlN, InGaN, AlGaN, InAlGaN and/or AlInN. The first semiconductor layer 113 may include an oxide, such as ZnO, although embodiments are not limited thereto.

The first semiconductor layer 113 may include a buffer layer. The buffer layer can attenuate a lattice mismatch between the substrate 111 and the nitride semiconductor layer.

The first semiconductor layer 113 may include an undoped semiconductor layer. The undoped semiconductor layer may be prepared as a GaN-based semiconductor layer that includes the group III-V compound semiconductor. The undoped semiconductor layer may have a first conductive property even when the conductive dopant is not intentionally added in the manufacturing process. Additionally, the undoped semiconductor layer may have a dopant concentration lower than that of the conductive dopant of the first conductive semiconductor layer 115.

The first semiconductor layer 113 may include at least one of the buffer layer and/or the undoped semiconductor layer, although embodiments are not limited thereto.

A light emitting structure 120 may be formed on the first semiconductor layer 113. The light emitting structure 120 may include the group III-V compound semiconductor. For example, the light emitting structure 120 may include the semiconductor having a compositional formula of $In_xAl_yGa_{1-x-y}N$ ($0 \leq x \leq 1$, $0 \leq y \leq 1$, $0 \leq x+y \leq 1$), and may emit the light having a predetermined peak wavelength in a wavelength range of an ultraviolet ray band to a visible ray band.

The light emitting structure 120 may include a first conductive semiconductor layer 115, a second conductive semiconductor layer 119, and an active layer 117 between the first conductive semiconductor layer 115 and the second conductive semiconductor layer 119.

The first conductive semiconductor layer 115 is formed under the first semiconductor layer 113. The first conductive semiconductor layer 115 may include a group III-V compound semiconductor doped with a first conductive dopant. The first conductive semiconductor layer 115 is an N type semiconductor layer and the first conductive dopant is an N type dopant that includes at least one of Si, Ge, Sn, Se and/or Te.

A superlattice structure including various semiconductor layers alternately stacked on each other may be formed between the first conductive semiconductor layer 115 and the first semiconductor layer 113. The superlattice structure may reduce a lattice defect. Each layer of the superlattice structure may have a thickness of approximately a few Å or greater.

A first conductive clad layer may be formed between the first conductive semiconductor layer 115 and the active layer 117. The first conductive clad layer may include a GaN-based semiconductor and may have a bandgap greater than the active layer 117. The first conductive clad layer may confine the carriers.

The active layer 117 may be formed under the first conductive semiconductor layer 115. The active layer 117 may selectively include a single quantum well structure, a multiple quantum well structure, a quantum wire structure and/or a quantum dot structure, and the active layer 117 may have a periodicity of the well layer and the barrier layer. The well layer may have a compositional formula of $In_xAl_yGa_{1-x-y}N$ ($0 \leq x \leq 1$, $0 \leq y \leq 1$, $0 \leq x+y \leq 1$) and the barrier layer may have a compositional formula of $In_xAl_yGa_{1-x-y}N$ ($0 \leq x \leq 1$, $0 \leq y \leq 1$, $0 \leq x+y \leq 1$).

The well layer/barrier layer may have at least one periodicity by using a stack structure of InGaN/GaN, AlGaN/GaN, InGaN/AlGaN, and/or InGaN/InGaN. The barrier layer may include a semiconductor material having a bandgap greater (or higher) than the well layer.

The second conductive semiconductor layer 119 may be formed under the active layer 117. The second conductive semiconductor layer 119 may include a semiconductor doped with a second conductive dopant. For example, the second conductive semiconductor layer 119 may include a compound semiconductor, such as GaN, InN, AlN, InGaN, AlGaN, InAlGaN, and/or AlInN. The second conductive semiconductor layer 119 may be a P type semiconductor layer and the second conductive dopant may be a P type dopant, such as Mg, Zn, Ca, Sr and/or Ba.

The second conductive semiconductor layer 119 may include a superlattice structure, such as InGaN/GaN and/or AlGaN/GaN. The superlattice structure of the second conductive semiconductor layer 119 may diffuse the current abnormally contained in the voltage, thereby protecting the active layer 117.

Additionally, the first conductive semiconductor layer 115 may be prepared as a P type semiconductor layer and the second conductive semiconductor layer 119 may be prepared as an N type semiconductor layer. A third conductive semiconductor layer having a polarity opposite to that of the second conductive semiconductor layer 119 may be formed on the second conductive semiconductor layer 119.

The light emitting structure 120 (of the light emitting device 100) may be defined by the first conductive semiconductor layer 115, the active layer 117 and the second conductive semiconductor layer 119. The light emitting structure 120 may have one of an N-P junction structure, a P-N junction structure, an N-P-N junction structure, and/or a P-N-P junction structure. In this example, the symbols "N" and "P" represent N and P type semiconductor layers, respectively, and the symbol "-" represents that two layers are directly or indirectly stacked on each other. The second conductive semiconductor layer 119 may be referred to as a uppermost layer of the light emitting structure 120 for ease of explanation.

The reflective electrode layer 131 may be formed under the second conductive semiconductor layer 119. The reflective electrode layer 131 may include at least one of an ohmic contact layer, a reflective layer, a diffusion barrier layer and/or a protective layer.

The reflective electrode layer 131 may include a structure of the ohmic contact layer/reflective layer/diffusion barrier layer/protective layer, the reflective layer/diffusion barrier layer/protective layer, the ohmic contact layer/reflective layer/protective layer, the reflective layer/diffusion barrier, and/or the reflective layer.

The ohmic contact layer may contact a lower surface of the second conductive semiconductor layer 119, in which the contact area of the ohmic contact layer corresponds to 70% or more based on the lower surface area of the second conductive semiconductor layer 119. The ohmic contact layer may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, RuOx, NiO, Ni, Cr and a compound and/or an alloy thereof. The ohmic contact layer may include at least one layer having a thickness of approximately 1 to 1,000 Å.

The reflective layer formed under the ohmic contact layer may include a material having reflectivity of approximately 70% or greater. For example, the reflective layer may include one selected from the group consisting of Al, Ag, Ru, Pd, Rh, Pt, Ir and an alloy having at least two of the above elements. A metal of the reflective layer may make ohmic-contact with the lower surface of the second conductive semiconductor layer 119. In this example, the ohmic contact layer may be omitted. The reflective layer may have a thickness of approximately 1 to 10,000 Å.

The diffusion barrier layer may include one selected from the group consisting of Au, Cu, Hf, Ni, Mo, V, W, Rh, Ru, Pt, Pd, La, Ta, Ti and an alloy having at least two of the above elements. The diffusion barrier layer may prevent the interlayer diffusion at the boundary region between two different layers. The diffusion barrier layer may have a thickness of approximately 1 to 10,000 Å.

The protective layer may include one selected from the group consisting of Au, Cu, Hf, Ni, Mo, V, W, Rh, Ru, Pt, Pd, La, Ta, Ti and an alloy having at least two of the above elements. The protective layer may have a thickness of approximately 1 to 10,000 Å.

The reflective electrode layer 131 may include the stack structure of a transmittive electrode layer/a reflective layer. The reflective electrode layer 131 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, and/or RuOx. The reflective layer may be formed under the transmittive electrode layer. The reflective layer may include a first layer having a first refractive index and a second layer having a second refractive index. The reflective layer may include the stack structure in which at least two pairs of the first and second layers are alternately stacked. The first refractive index is different from the second refractive index, and the first and second layers may include a material having the refractive index in the range of 1.5 to 2.4. For example, the first and second layers may include a conductive material or an insulating material. Such a structure may be defined as a DBR (distributed bragg reflection) structure.

A light extracting structure, such as a roughness, may be formed on a surface of at least one of the second conductive semiconductor layer 119 and/or the reflective electrode layer 131. The light extracting structure may change a critical angle of the incident layer to improve light extraction efficiency.

A first electrode 135 may be formed under a predetermined region A1 of the first conductive semiconductor layer 115, and a second electrode 137 may be formed under a predetermined region of the reflective electrode layer 131. A first connection electrode 141 may be formed under the first electrode 135, and a second connection electrode 143 may be formed under the second electrode 137.

The first electrode 135 may be electrically connected to the predetermined region A1 of the first conductive semiconductor layer 115. The first electrode 135 may include an electrode pad, although embodiments are not limited thereto.

The first electrode 135 may be spaced apart from lateral sides of the active layer 117 and the second conductive semiconductor layer 119, and the first electrode 135 may have an area smaller than the predetermined region A1 of the first conductive semiconductor layer 115.

The second electrode 137 may be physically and/or electrically connected to the second conductive semiconductor layer 119 through the reflective electrode layer 131. The second electrode 137 may include an electrode pad.

The first and second electrodes 135 and 137 may include at least one of an adhesive layer, a reflective layer, a diffusion barrier layer and/or a bonding layer. The adhesive layer may make ohmic-contact with a lower surface of the predetermined region A1 of the first conductive semiconductor layer 115. The adhesive layer may include one selected from the group consisting of Cr, Ti, Co, Ni, V, Hf and an alloy thereof, and may have a thickness of approximately 1 to 1,000 Å. The reflective layer may be formed under the adhesive layer and may include one selected from the group consisting of Ag, Al, Ru, Rh, Pt, Pd and an alloy thereof. The reflective layer may have a thickness of approximately 1 to 10,000 Å. The diffusion barrier layer may be formed under the reflective layer and may include one selected from the group consisting of Ni, Mo, W, Ru, Pt, Pd, La, Ta, Ti and an alloy thereof. The diffusion barrier layer may have a thickness of approximately 1 to 10,000 Å. The bonding layer may be bonded to the first connection electrode 141, and may include one selected from the group consisting of Al, Ru, Rh, Pt and an alloy thereof. The bonding layer may have a thickness of approximately 1 to 10,000 Å.

The first and second electrodes 135 and 137 may have a same stack structure or different stack structures. The stack structure of the second electrode 137 may be smaller than the stack structure of the first electrode 135. For example, the first electrode 135 may have the stack structure of the adhesive layer/reflective layer/diffusion barrier layer/bonding layer or the adhesive layer/diffusion barrier layer/bonding layer, and the second electrode 137 may have the stack structure of the adhesive layer/reflective layer/diffusion barrier layer/bonding layer or the adhesive layer/diffusion barrier layer/bonding layer.

A top surface area of the second electrode 137 may be equal to a lower surface area of the reflective electrode layer 131, or the top surface area of the second electrode 137 may be at least larger than a top surface area of the second connection electrode 143.

At least one of the first and second electrodes 135 and 137 may include a current diffusion pattern having an arm structure or a finger structure that branches from the electrode pad. Additionally, the first and second electrodes 135 and 137 may include one electrode pad or a plurality of electrode pads, although embodiments are not limited thereto.

The first and second connection electrodes 141 and 143 may serve as a lead for supplying power and a heat dissipation path. The first and second connection electrodes 141 and 143 may have a column shape. For example, the first and second connection electrodes 141 and 143 may have a spherical shape, a cylindrical shape, a polygonal column shape and/or a random shape. The polygonal column shape may be an equiangular column shape or not, although embodiments are not limited thereto. The top and lower surfaces of the first and second connection electrodes 141 and 143 may have a circular shape and/or a polygonal shape, although embodiments are not limited thereto. The lower surface area of the first and second connection electrodes 141 and 143 may be different from the top surface area of the first and second connection electrodes 141 and 143. For example, the lower surface area of the first and second connection electrodes 141 and 143 may be larger or smaller than the top surface area of the first and second connection electrodes 141 and 143.

One of the first and second connection electrodes 141 and 143 may be smaller than a width of a lower surface of the light emitting structure 120 and may be larger than a diameter or a width of a lower surface of the first and second electrodes 135 and 137.

The diameter or the width of the first and second connection electrodes 141 and 143 may be in the range of 1 μm~100,000 μm and the height of first and second connection electrodes 141 and 143 may be in the range of 1 μm~100,000 μm. The height H1 of the first connection electrode 141 may be greater than the height H2 of the second connection electrode 143 and lower surfaces of the first and second connection electrodes 141 and 143 may be aligned on a same plane (i.e., a horizontal plane).

The first and second connection electrodes 141 and 143 may be prepared as a single layer by using one metal or an alloy. The width and the height of the single layer may be in the range of 1 μm~100,000 μm. For example, the single layer may have the thickness larger than the thickness of the second connection electrode 143.

The first and second connection electrodes 141 and 143 may include one selected from the group consisting of Ag, Al, Au, Cr, Co, Cu, Fe, Hf, In, Mo, Ni, Si, Sn, Ta, Ti, W and an alloy thereof. In order to improve adhesive strength with respect to the first and second electrodes 135 and 137, the first and second connection electrodes 141 and 143 may be plated with a metal that includes one selected from the group consisting of In, Sn, Ni, Cu and an alloy thereof. The plating thickness may be in the range of 1~100,000 Å.

A plating layer can be further formed on surfaces of the first and second connection electrodes 141 and 143. The plating layer may include Tin or an alloy thereof, Ni or an alloy thereof, and/or Tin-Ag—Cu. The plating layer may have a thickness of approximately 0.5 μm~10 μm. The plating layer can improve a bonding strength with respect to other bonding layers.

The insulating layer 133 may be formed under the reflective electrode layer 131. The insulating layer 133 can be formed on the lower surface of the second conductive semiconductor layer 119, lateral sides of the second conductive semiconductor layer 119 and the active layer 117, and the lower surface of the predetermined region A1 of the first conductive semiconductor layer 115. The insulating layer 133 may be formed on the lower region of the light emitting structure 120 except for the region for the reflective electrode layer 131, the first electrode 135 and the second electrode 137 to electrically protect the lower portion of the light emitting structure 120.

The insulating layer 133 may include an insulating material or an insulating resin formed by using oxide, nitride, fluoride or sulfide including at least one of Al, Cr, Si, Ti, Zn and/or Zr. For example, the insulating layer 133 may include one selected from the group consisting of $SiO_2$, $Si_3N_4$, $Al_2O_3$ and $TiO_2$. The insulating layer 133 may be prepared as a single layer or as multiple layers, although embodiments are not limited thereto. The insulating layer 133 may prevent a short between layers of the light emitting structure 120 when a metal structure is formed under the light emitting structure 120 for the purpose of flip bonding.

The insulating layer 133 can be formed only on a surface of the light emitting structure 120 without being formed on a lower surface of the reflective electrode layer 131. Since the support member 151 having the insulating property is formed on the lower surface of the reflective electrode layer 131, the insulating layer 133 may not extend to the lower surface of the reflective electrode layer 131.

The insulating layer 133 has the DBR structure in which the first and second layers having refractive indexes different from each other are alternately aligned. The first layer may include one of $SiO_2$, $Si_3N_4$, $Al_2O_3$, and/or $TiO_2$, and the second layer may include materials except for materials of the first layer. In this example, the reflective electrode layer may be omitted.

The insulating layer 133 may have a thickness in the range of 100 to 10,000 Å. If the insulating layer 133 is prepared as the multiple layers, each layer may have the thickness in the range of 1 to 50,000 Å or 100 to 10,000 Å. The thickness of each layer of the insulating layer 133 having the multiple layers may vary a reflective efficiency according to the emission wavelength.

The first and second connection electrodes 141 and 143 may include Ag, Al, Au, Cr, Co, Cu, Fe, Hf, In, Mo, Ni, Si, Sn, Ta, Ti, W and/or an alloy thereof. Additionally, the first and second connection electrodes 141 and 143 may have a plating layer including In, Sn, Ni, Cu and an alloy thereof to improve an adhesive strength with respect to the first and second electrodes 135 and 137. In this example, the plating layer may have the thickness in the range of 1~100,000 Å. The first and second connection electrodes 141 and 143 may be used as a solder ball or a metal bump, although embodiments are not limited thereto.

The support member 151 may serve as a support layer to support the light emitting device 100. The support member 151 may include an insulating material. For example, the insulating material may be a resin that includes silicon or epoxy. Additionally, the insulating material may include paste or insulating ink. The insulating material may also include a resin selected from the group consisting of a polyacrylate resin, an epoxy resin, a phenolic resin, a polyamides resin, a polyimide resin, an unsaturated polyesters resin, a polyphenylene ether resin (PPE), a polyphenylene oxide resin (PPO), a polyphenylene sulfides resin, a cyanate ester resin, benzocyclobutene (BCB), Polyamidoamine Dendrimers (PAMAM), Polypropylene-imine, Dendrimers (PPI), PAMAM-OS (organosilicon) having an internal structure of PAMAM and an outer surface of organosilicon, and/or a combination thereof. The material for the support member 151 may be different from the material for the insulating layer 133.

At least one of compounds, such as oxide, nitride, fluoride or sulfide that includes at least one of Al, Cr, Si, Ti, Zn and/or Zr, may be added to the support member 151. The compound added to the support member 151 may be a thermal diffuser. The thermal diffuser is a powder particle having a predetermined size, a grain, filler and/or an additive. The support member 151 including the thermal diffuser may be hereafter described for ease of explanation. The thermal diffuser may include an insulating material or a conductive material having a size of 1 Å~100,000 Å. In order to improve thermal diffusion efficiency, the thermal diffuser may have a size of 1,000 Å~50,000 Å. The grain of the thermal diffuser may have a spherical shape or an irregular shape, although embodiments are not limited thereto.

The thermal diffuser may include a ceramic material. The ceramic material may include at least one of LTCC (low temperature co-fired ceramic), HTCC (high temperature co-fired ceramic), alumina, quartz, calcium zirconate, forsterite, SiC, graphite, fused-silica, mullite, cordierite, zirconia, beryllia, and/or aluminum nitride. The ceramic material may include a metal nitride having a thermal conductivity higher than nitride or oxide. For example, the metal nitride may include a material having the thermal conductivity equal to or greater than 140 W/mK. For example, the ceramic material may include one selected from the group consisting of $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and/or AlN. The thermal conductive material may include a C-component, such as diamond or CNT.

The support member 151 may be prepared as a single layer or as multiple layers, although embodiments are not limited thereto. The support member 151 may be provided with a ceramic powder, so strength and thermal conductivity of the support member 151 can be improved.

Additionally, an amount of the thermal diffuser added to the support member 151 may be 1~99 wt %. In order to improve thermal diffusion efficiency, 50~99 wt % of the thermal diffuser may be added to the support member 151. Since the thermal diffuser is added to the support member 151, thermal conductivity may be more improved at an interior of the support member 151. Additionally, the support member 151 may have the thermal expansion coefficient of 4-11 [$\times 10^6$/° C.]. The above thermal expansion coefficient may be equal to or similar to the thermal expansion coefficient of the substrate 111, such as a sapphire substrate, so the wafer may not be warped or damaged caused by a difference in the thermal expansion coefficient between the support member 151 and the light emitting structure 120 formed on the substrate 111, thereby improving reliability of the light emitting device 100.

The lower surface area of the support member 151 may be substantially equal to the top surface area of the support member 151. Additionally, the lower surface area of the support member 151 may be equal to the top surface area of the first conductive semiconductor layer 115. The width of the lower surface of the support member 151 may be equal to the width of the top surface of the substrate 111 and the width of the top surface of the semiconductor layer 115. Thus, since individual chips may be divided after the support member 151 has been formed, the lateral sides of the support member 151, the substrate 111 and the first conductive semiconductor layer 115 may be aligned on a same plane.

Referring to FIG. 2, a length D1 of a first lateral side of the support member 151 may be substantially the same as a length of a first lateral side of the substrate 111, and a length D2 of a second lateral side of the support member 151 may be substantially the same as a length of a second lateral side of the substrate 111. Additionally, a distance D5 between the first connection electrode 141 and the second connection electrode 143 is an interval between two adjacent electrode pads and may correspond to ½ or more with respect to the length of one lateral side of the light emitting device 100.

The lower surface of the support member 151 may be a substantially flat surface or an irregular surface, although embodiments are not limited thereto.

A thickness T1 of the first region of the support member 151 may be thicker than a thickness H2 of the second connection electrode 143. Alternatively, the thickness T1 of the first region of the support member 151 may be thinner than the thickness H2 of the second connection electrode 143. If the thickness of the insulating layer 133 is thicker than the thickness of the second connection electrode 143, then the thickness of the support member 151 may become thin. A thickness T2 of the second region of the support member 151 may be thicker than a thickness of the first connection electrode 141. The support member 151 may have the thickness in the range of 1 μm~100,000 μm or 50 μm~1,000 μm.

The lower surface of the support member 151 may be lower than the lower surfaces of the first and second electrodes 135 and 137, and/or may be aligned on the same plane (i.e., horizontal plane) with the lower surfaces of the first and second connection electrodes 141 and 143.

The support member 151 may contact outer peripheral surfaces of the first and second electrodes 135 and 137 and the first and second connection electrodes 141 and 143. Thus, heat induced from the first and second electrodes 135 and 137 and the first and second connection electrodes 141 and 143 may be diffused and dissipated through the support member 151. The thermal conductivity of the support member 151 can be improved by the thermal diffuser contained in the support member 151, so that the support member 151 can dissipate the heat through the whole surface of the support member 151. Thus, reliability of the light emitting device 100 can be improved against heat.

The lateral side of the support member 151 may be aligned on the same plane (i.e., a vertical plane) with the lateral sides of the light emitting structure 120 and the substrate 111.

The light emitting device 100 may be mounted through a flip scheme, so most of the light is emitted toward a top surface of the substrate 111 and some light is emitted through the lateral sides of the substrate 111 and the light emitting structure 120. Thus, light loss caused by the first and second electrodes 135 and 137 can be reduced. Accordingly, the light extraction efficiency and heat dissipation efficiency of the light emitting device 100 may be improved.

FIGS. 3 to 9 are sectional views showing a manufacturing process for the light emitting device according to the first embodiment. Although the following description may be provided based on an individual device to facilitate explanation, the light emitting device may be manufactured at the wafer level and the individual device may be manufactured through the process described below. However, manufacturing of the individual device may not be limited to the process described below, but process operations may be increased or reduced to manufacture the individual device.

Figure 3:
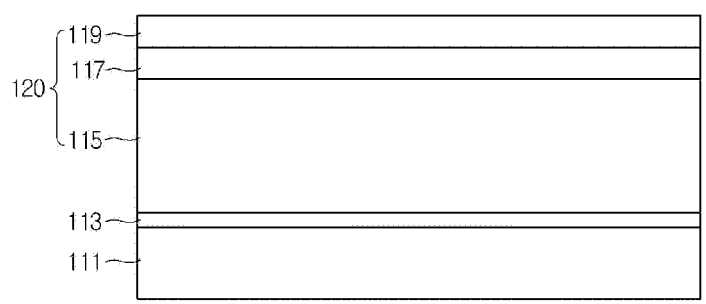
FIGS. 3 to 9 are sectional views showing a manufacturing process for the light emitting device according to the first embodiment.

Referring to FIG. 3, the substrate 111 may be provided in growth equipment, and the compound semiconductor including group II to VI elements is formed on the substrate 111 in the form of a layer or a pattern. The substrate 111 may serve as a growth substrate.

The substrate 111 may include a transmittive substrate, an insulating substrate and/or a conductive substrate. For example, the substrate 111 may include one selected from the group consisting of $Al_2O_3$, GaN, SiC, ZnO, Si, GaP, InP, $Ga_2O_3$, and/or GaAs. The substrate 111 may be formed on the top surface thereof with a light extracting structure, such as a concavo-convex pattern. The concavo-convex pattern may change the critical angle of the light, thereby improving light extraction efficiency.

The growth equipment may include an E-beam evaporator, PVD (physical vapor deposition) equipment, CVD (chemical vapor deposition) equipment, PLD (plasma laser deposition) equipment, a dual-type thermal evaporator, sputtering equipment, and/or MOCVD (metal organic chemical vapor deposition) equipment, although embodiments are not limited thereto.

The first semiconductor layer 113 is formed on the substrate 111. The first semiconductor layer 113 can be formed by using the compound semiconductor that includes the group III-V elements. The first semiconductor layer 113 may serve as a buffer layer to reduce a lattice mismatch with respect to the substrate 111. The first semiconductor layer 113 may be an undoped semiconductor layer that includes a GaN-based semiconductor that is not intentionally doped.

The light emitting structure 120 is formed on the first semiconductor layer 113. The light emitting structure 120 may include the first conductive semiconductor layer 115, the active layer 117 and the second conductive semiconductor layer 119, which may be sequentially formed.

The first conductive semiconductor layer 115 may include the group III-V compound semiconductor doped with the first conductive dopant. The first conductive semiconductor layer 115 may include one selected from the group consisting of GaN, AlN, AlGaN, InGaN, InN, InAlGaN, AlInN, AlGaAs, GaP, GaAs, GaAsP, and/or AlGaInP. If the first conductive semiconductor layer 115 is an N type semiconductor layer, the first conductive dopant includes the N type dopant such as Si, Ge, Sn, Se and/or Te. The first conductive semiconductor layer 115 can be prepared as a single layer or as multiple layers, although embodiments are not limited thereto. The first conductive semiconductor layer 115 may further include a superlattice structure that includes various materials, although embodiments are not limited thereto.

The active layer 117 is formed on the first conductive semiconductor layer 115. The active layer 117 may include at least one of a single quantum well structure, a multiple quantum well structure, a quantum wire structure and/or a quantum dot structure. The active layer 117 can be formed by using the semiconductor material of the group III-V elements such that the active layer 117 may have a periodicity of the well layer and the barrier layer having the compositional formula of $In_xAl_yGa_{1-x-y}N$ (0≤x≤1, 0≤y≤1, 0≤x+y≤1). For example, the active layer 117 may have the periodicity of the InGaN well layer/GaN barrier layer, the InGaN well layer/AlGaN barrier layer, and/or the InGaN well layer/InGaN barrier layer, although embodiments are not limited thereto.

A conductive clad layer can be formed on and/or under the active layer 117. The conductive clad layer may include an AlGaN-based semiconductor. The barrier layer of the active layer 117 may have a bandgap higher (or greater) than the well layer, and the conductive clad layer may have the bandgap greater of the barrier layer.

The second conductive semiconductor layer 119 is formed on the active layer 117. The second conductive semiconductor layer 119 may include the group III-V compound semiconductor doped with second conductive dopant. For example, the second conductive semiconductor layer 119 may include one selected from the group consisting of GaN, AlN, AlGaN, InGaN, InN, InAlGaN, AlInN, AlGaAs, GaP, GaAs, GaAsP, and/or AlGaInP. If second conductive semiconductor layer 119 is a P type semiconductor layer, the second conductive dopant may include the P type dopant such as Mg or Zn. The second conductive semiconductor layer 119 can be prepared as a single layer or as multiple layers, although embodiments are not limited thereto. The second conductive semiconductor layer 119 may further include a superlattice structure that includes various materials, although embodiments are not limited thereto.

The light emitting structure 120 may be defined by the first conductive semiconductor layer 115, the active layer 117 and the second conductive semiconductor layer 119. Additionally, a third conductive semiconductor layer having a polarity opposite to that of the second conductive semiconductor layer 119, (i.e., the N type semiconductor layer) may be formed on the second conductive semiconductor layer 119. Thus, the light emitting structure 120 may have one of an N-P junction structure, a P-N junction structure, an N-P-N junction structure, and/or a P-N-P junction structure.

Figure 4:
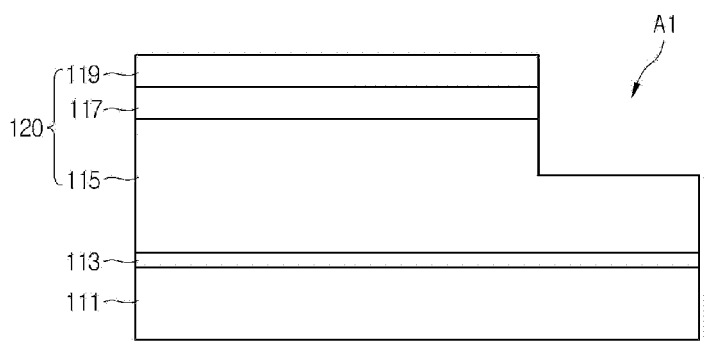

Referring to FIG. 4, the predetermined region A1 of the light emitting structure 120 may be etched. The predetermined region A1 of the light emitting structure 120 may expose the first conductive semiconductor layer 115, and the exposed portion of the first conductive semiconductor layer 115 may be lower than the top surface of the active layer 117.

During the etching process, the predetermined region A1 of the light emitting structure 120 is dry-etched after masking the top surface of the light emitting structure 120 using the mask pattern. The dry etching can be performed by using at least one of ICP (Inductively Coupled Plasma) equipment, RIE (Reactive Ion Etching) equipment, CCP (Capacitive Coupled Plasma) equipment, and/or ECR (Electron Cyclotron Resonance) equipment. The etching process may be performed through a wet etching process, although embodiments are not limited thereto.

The predetermined region A1 of the light emitting structure 120 may be an etching region and one or a plurality of predetermined regions A1 may be formed.

Figure 5:
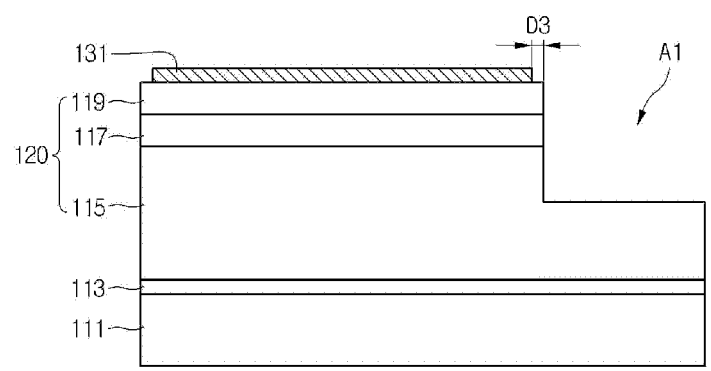

Referring to FIG. 5, the reflective electrode layer 131 may be formed on the light emitting structure 120. The reflective electrode layer 131 may have an area smaller than a top surface area of the second conductive semiconductor layer 119 to prevent a short when the reflective electrode layer 131 is manufactured. The reflective layer 131 may be deposited by using sputter equipment and/or deposition equipment after masking the region, which is spaced apart from the upper edge by a predetermined distance D3, and the predetermined region A1 of the light emitting structure 120 using the mask.

The reflective electrode layer 131 may include a metallic material having reflectivity of at least 70% or 90%.

The reflective electrode layer 131 may include the structure of the ohmic contact layer/reflective layer/diffusion barrier layer/protective layer, the reflective layer/diffusion barrier layer/protective layer, the ohmic contact layer/reflective layer/protective layer, and/or the reflective layer. A description about material and thickness of each layer may be provided to the description related to FIG. 1.

The processes shown in FIGS. 4 and 5 can be interchanged, and embodiments are not limited thereto.

Figure 6:
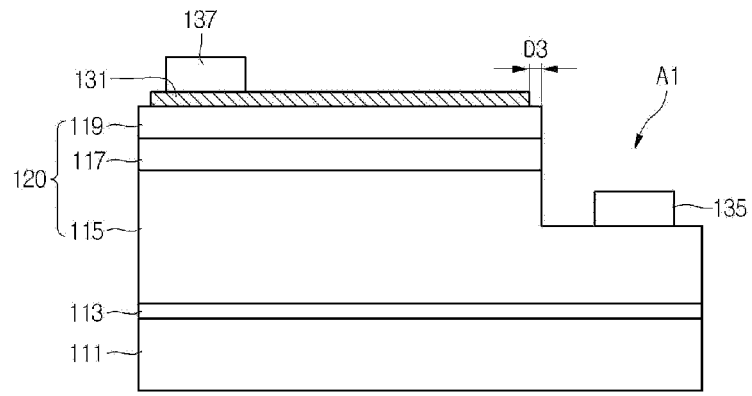

Referring to FIG. 6, the second electrode 137 is formed on the first reflective electrode layer 131 after forming the first electrode 135 on the first conductive semiconductor layer 115. The first and second electrodes 135 and 137 can be formed by using sputter equipment and/or deposition equipment after masking the region except for the electrode region using the mask, although embodiments are not limited thereto. The first and second electrodes 135 and 137 may include one selected from the group consisting of Cr, Ti, Co, Ni, V, Hf, Ag, Al, Ru, Rh, Pt, Pd, Ni, Mo, W, La, Ta, Ti and/or an alloy thereof. The first and second electrodes 135 and 137 may be prepared as multiple layers. For example, the first and second electrodes 135 and 137 may include at least two of the adhesive layer, the reflective layer, the diffusion barrier layer and the bonding layer formed by using the above elements. The first and second electrodes 135 and 137 can be formed to have a same stack structure through the same manufacturing process, although embodiments are not limited thereto.

The second electrode 137 may physically contact the reflective electrode layer 131 and the second conductive semiconductor layer 119.

Figure 7:
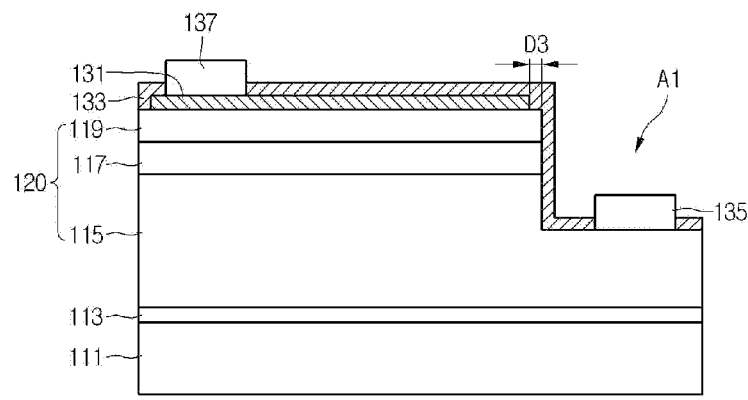

Referring to FIG. 7, the insulating layer 133 may be formed on the reflective electrode layer 131 through the sputtering or deposition process. The insulating layer 133 may be formed over the whole area of the reflective electrode layer 131 except for the regions for the first and second electrodes 135 and 137, thereby covering the top surfaces of the reflective electrode layer 131 and the second conductive semiconductor layer 119 and the exposed portion of the first conductive semiconductor layer 115.

The insulating layer 133 may include an insulating material or an insulating resin formed by using oxide, nitride, fluoride or sulfide including Al, Cr, Si, Ti, Zn or Zr. For example, the insulating layer 133 may include one selected from the group consisting of $SiO_2$, $Si_3N_4$, $Al_2O_3$ and $TiO_2$. The insulating layer 133 may be prepared as a single layer or as multiple layers, although embodiments are not limited thereto.

The process for forming the electrodes 135 and 137 shown in FIG. 6 may be interchanged with the process for forming the insulating layer 133 shown in FIG. 7.

Figure 8:
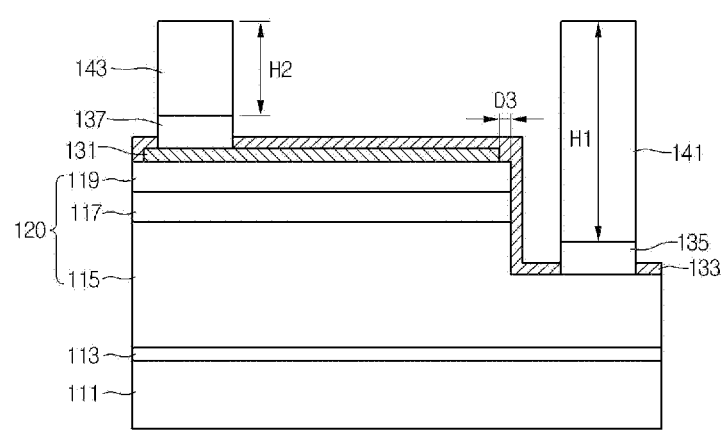

Referring to FIG. 8, the first connection electrode 141 is bonded to the first electrode 135 and the second connection electrode 143 is bonded to the second electrode 137. The first connection electrode 141 may include a conductive pad, such as a solder ball and/or a metal bump and may be bonded to the first electrode 135. The first connection electrode 141 can be vertically aligned to the top surface of the first conductive semiconductor layer 115. The second connection electrode 143 may include a conductive pad, such as a solder ball and/or a metal bump, and/or may be bonded to the second electrode 137. The second connection electrode 143 can be vertically aligned to the top surface of the second conductive semiconductor layer 119.

The height H1 of the first connection electrode 141 may be greater than the height H2 of the second connection electrode 143. The lower surfaces of the first and second connection electrodes 141 and 143 may be provided on different planes and the top surfaces of the first and second connection electrodes 141 and 143 may be aligned on the same plane (i.e., the same horizontal plane).

Figure 9:
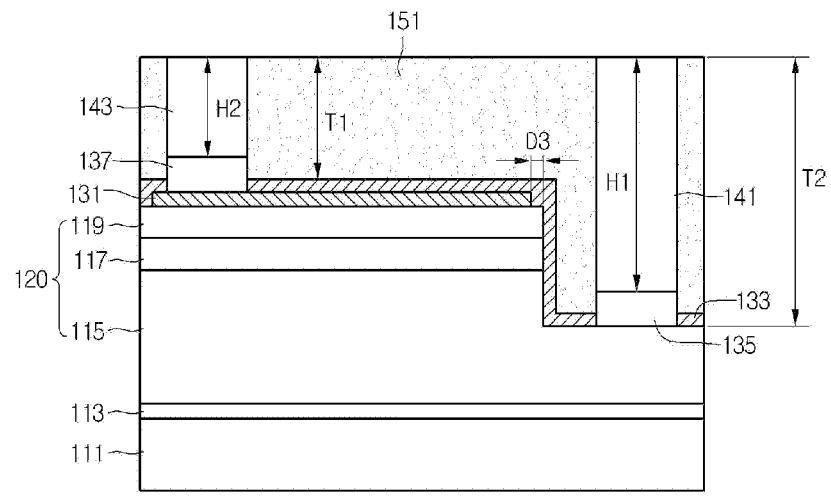

Referring to FIG. 9, the support member 151 may be formed on the insulating layer 133 through a squeeze scheme and/or a dispensing scheme.

The support member 151 may be prepared as an insulating support layer by adding the thermal diffuser to a resin, such as silicon or epoxy, for example.

The thermal diffuser may include at least one of oxide, nitride, fluoride and/or sulfide including Al, Cr, Si, Ti, Zn or Zr. For example, the thermal diffuser may include a ceramic material. The thermal diffuser may be a powder particle having a predetermined size, a grain, filler and/or an additive.

The thermal diffuser may include the ceramic material. The ceramic material may include a LTCC (low temperature co-fired ceramic) or a HTCC (high temperature co-fired ceramic). The ceramic material may include metal nitride having a thermal conductivity higher than a thermal conductivity of nitride or oxide. For example, the metal nitride may include a material having the thermal conductivity equal to or higher than 140 W/mK. For example, the ceramic material may include one selected from the group consisting of $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and/or AlN. The thermal conductive material may include a C-component, such as diamond or CNT. Additionally, the amount of the thermal diffuser added to the support member 151 may be 1~99 wt %. In order to improve the thermal diffusion efficiency, at least 50 wt % of the thermal diffuser may be added to the support member 151.

The support member 151 can be formed by mixing a polymer with an ink or paste using a ball mill, a planetary ball mill, an impellor mixing, a bead mill or a basket mill. In this example, a solvent and a dispersing agent can be used to uniformly distribute the mixture. The solvent may be added to adjust viscosity. In an example of ink, 3 to 400 Cps of the solvent is added. Additionally, in the example of paste, 100 to one million Cps of the solvent is added. The solvent may include one selected from the group consisting of water, methanol, ethanol, isopropanol, butylcabitol, MEK, toluene, xylene, diethyleneglycol (DEG), formamide (FA), α-terpineol (TP), γ-butylrolactone (BL), Methylcellosolve (MCS), Propylmethylcellosolve (PM), and/or a combination thereof. In order to reinforce a coupling strength between particles, silane-based additives, such as 1-Trimethylsilylbut-1-yne-3-ol, Allytrimethylsilane, Trimethylsilyl methanesulfonate, Trimethylsilyl tricholoracetate, Methyl trimethylsilylacetate, and/or Trimethylsilyl propionic acid, can be added to the solvent. In this example, gelation may occur so an addition of silane-based additives may be considered.

In the manufacturing process, the connection electrode (such as the solder bump) may be previously manufactured and bonded, and the support member 151 may be provided around the connection electrode. In contrast, after printing or dispensing the insulating layer including the ink or the paste, the insulating layer may be cured, and then a conductive material is filled in a hole corresponding to the connection electrode, thereby forming the connection electrode.

The support member 151 may have the height corresponding to the top surface of the first and second connection electrodes 141 and 143.

The support member 151 may be filled around the first and second connection electrodes 141 and 143 and the first and second electrodes 135 and 137. The top surfaces of the first and second connection electrodes 141 and 143 are exposed through the top surface of the support member 151.

The support member 151 may be an insulating support layer that supports the connection electrodes 141 and 143. The connection electrodes 141 and 143 may be inserted into the support member 151.

The support member 151 may have a thickness T sufficient for exposing the top surfaces of the first and second connection electrodes 141 and 143.

The support member 151 may be cured at the predetermined temperature. For example, the support member 151 may be cured at the temperature of 200° C.±100° C., which may not exert influence upon the semiconductor layer.

After the support member 151 has been formed, connection electrode holes may be formed in the support member 151 to form the first and second connection electrodes 141 and 143.

In at least one embodiment, the support member 151 may be made of a non-transparent material such that light does not pass through the support member 151.

The substrate 111 may have the thickness of approximately 150 μm or greater. The substrate 111 may have the thickness in the range of 130 μm to 150 μm by polishing the lower surface of the substrate 111. Since the support member 151 is provided in the light emitting device 100 in opposition to the substrate 111, the substrate 111 can be used as a light emitting layer, so that the thickness of the substrate 111 may become thin. The CMP (chemical mechanical polishing) can be performed with respect to the surfaces of the support member 151 and the first and second connection electrodes 141 and 143.

Figure 10:
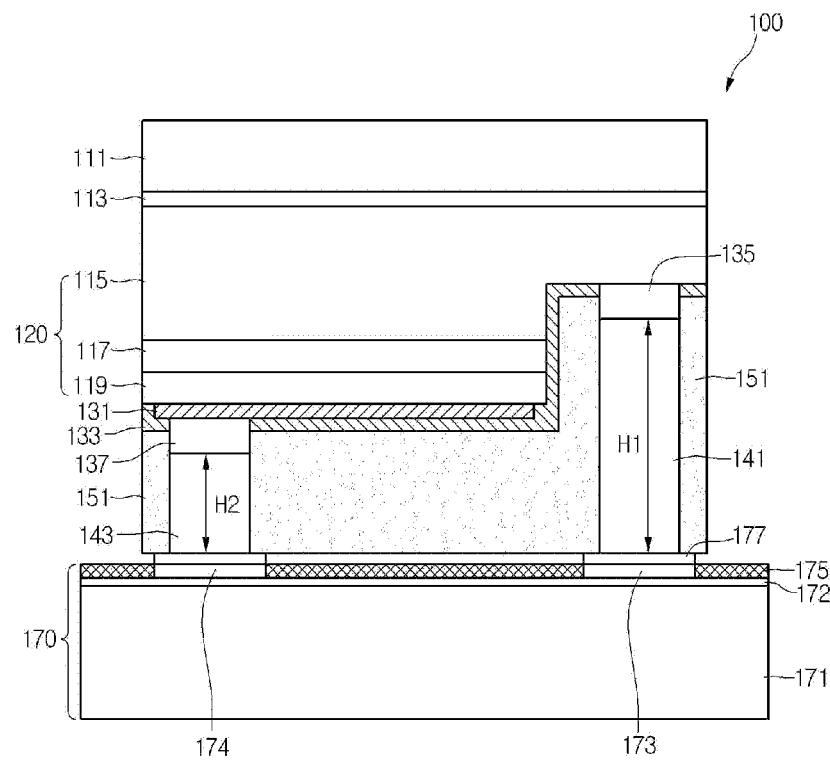
FIG. 10 is a side sectional view of a light emitting apparatus having the light emitting device shown in FIG. 1.

After rotating the light emitting device manufactured as shown in FIG. 9 by an angle of 180°, the light emitting device may be as shown in FIG. 10 to use the light emitting device as a light emitting module. The light emitting device may be packaged into a support member at a wafer level and may be divided into individual chips through scribing, breaking and/or cutting work, so that the light emitting device as shown in FIG. 9 may be provided. The light emitting device may be packaged at the wafer level, so that the light emitting device can be mounted on the module substrate through the flip bonding scheme without using a wire.

The top surface area of the support member 151 may be equal to the lower surface area of the substrate 111, and the height of the support member 151 may be higher than the top surfaces of the first and second electrodes 135 and 137.

FIG. 10 is a side sectional view showing a light emitting apparatus having the light emitting device (shown in FIG. 1). Other embodiments and configurations may also be provided.

Referring to FIG. 10, the light emitting device 100 is mounted on a module substrate 170 through a flip scheme.

The module substrate 170 may include a metal layer 171, an insulating layer 172 and a protective layer 175. The insulating layer 172 may be formed on the metal layer 171 of the module substrate 170, and first and second electrode pads 173 and 174 may be formed on the insulating layer 172. The first and second electrode pads 173 and 174 may be land patterns for supplying power. The protective layer 175 may be formed on the insulating layer 172 except for a region for the first and second electrode pads 173 and 174. The protective layer 175 may be a solder resist layer and may include a white protective layer or a green protective layer. The protective layer 175 may effectively reflect the light, so that a quantity of reflected light can increase.

The module substrate 170 may include a printed circuit board (PCB) having a circuit pattern (not shown). The module substrate 170 may also include a resin PCB, a metal core PCB (MCPCB), and/or a flexible PCB (FPCB), although embodiments are not limited thereto.

The first connection electrode 141 (of the light emitting device 100) may be aligned to correspond to the top surface of the first electrode pad 173, and the second connection electrode 143 (of the light emitting device 100) may be aligned correspond to the top surface of the second electrode pad 174. The first electrode pad 173 is bonded with the first connection electrode 141 by a bonding material 177, and the second electrode pad 174 is bonded with the second connection electrode 143 by the bonding material 177.

The light emitting device 100 may operate as power is applied thereto from the first and second electrode pads 173 and 174. Heat generated from the light emitting device 100 may be transferred through the first and second connection electrodes 141 and 143, and may then be dissipated to the outside through the entire surface of the support member 151. The lower surface of the support member 151 spaced apart from the top surface of the module substrate 170 by a predetermined distance corresponding to thickness of the bonding material 177.

A distance between the lower surfaces of the first and second connection electrodes 141 and 143 (of the light emitting device 100) and the top surface of the module substrate 170 may be equal to a distance between the lower surface of the support member 151 and the top surface of the module substrate 170.

Although it has been described that one light emitting device 100 is mounted on the module substrate 170, a plurality of light emitting devices may be arrayed on the module substrate 170, and embodiments are not limited thereto.

Figure 11:
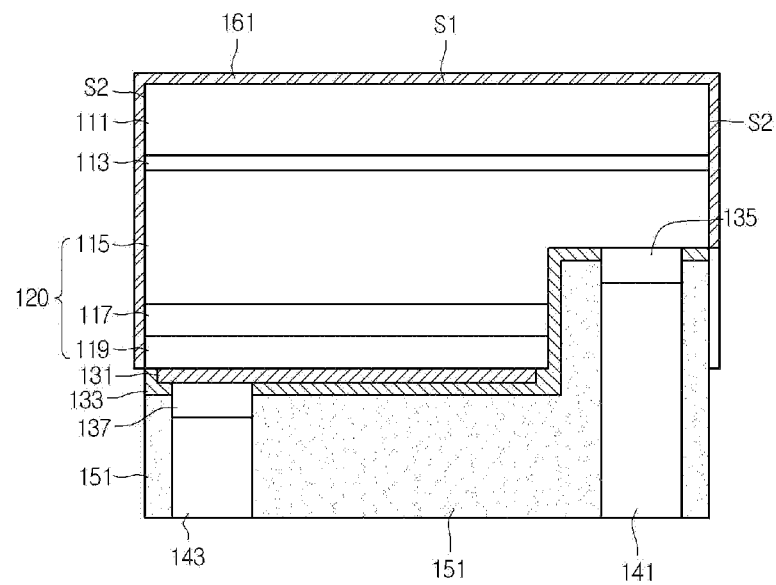
FIG. 11 is a side sectional view of a light emitting device according to a second embodiment.

FIG. 11 is a side sectional view showing a light emitting device according to a second embodiment. Other embodiments and configurations may also be provided.

Referring to FIG. 11, the light emitting device may include a phosphor layer 161 formed on a surface of the substrate 111 in opposition to the support member 151 (i.e., formed on the light exit surface). The phosphor layer 161 may include a phosphor film or a coated layer, and may be prepared as a single layer or as multiple layers.

The phosphor layer 161 may include a transmittive resin layer containing luminescence materials. The transmittive resin layer may include silicon or epoxy, and the luminescence material may include one selected from the group consisting of YAG, TAG, silicate, nitride, and/or oxy-nitride-based material. The luminescence material may include at least one of a red luminescence material, a yellow luminescence material and/or a green luminescence material, and may excite a part of the light emitted from the active layer 117 in such a manner that the light has various wavelengths.

The phosphor layer 161 may be formed on a top surface S1 of the substrate 111 and lateral sides S2 of the substrate 111 and the light emitting structure 120. The phosphor layer 161 may have the thickness in the range of 1~100,000 μm or 1~10,000 μm.

The phosphor layer 161 may include various phosphor layers different from each other, in which a first layer is one of red, yellow and/or green phosphor layers, and a second layer is formed on the first layer and is different from the first layer. Two different phosphor layers can be disposed on first and second regions, which are not overlapped with each other, respectively. A protective layer including a transmittive resin material can be formed on the lateral sides of the phosphor layer 161 and the light emitting structure, although embodiment are not limited thereto.

Figure 12:
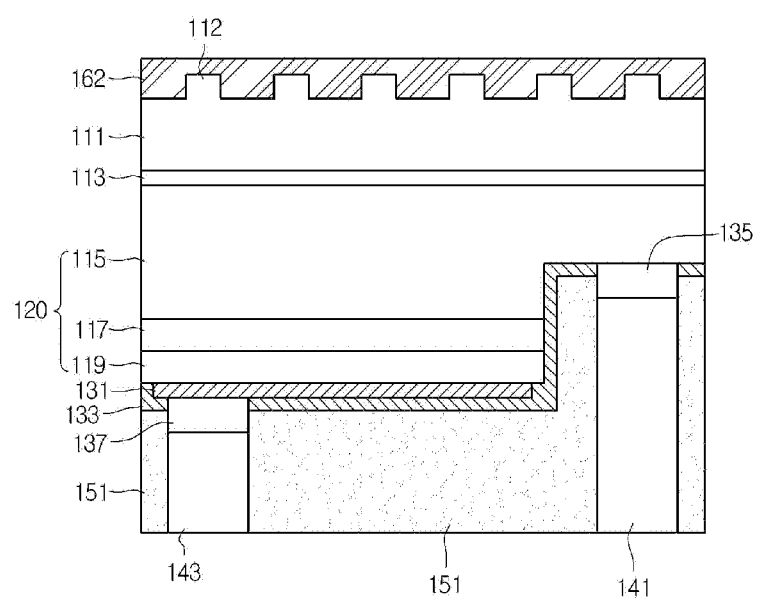
FIG. 12 is a side sectional view of a light emitting device according to a third embodiment.

FIG. 12 is a side sectional view showing a light emitting device according to a third embodiment. Other embodiments and configurations may also be provided.

Referring to FIG. 12, a plurality of protrusions 112 are formed at an upper portion of the substrate 111. The protrusions 112 protrude in opposition to the support member 151 to change a critical angle of the light incident through the substrate 111. Thus, the light extraction efficiency of the light emitting device can be improved. The protrusions 112 may have lens shapes and/or polygonal shapes and may be arranged in the form of a stripe pattern or a matrix.

A phosphor layer 162 may be provided on the top surface of the substrate 111. A lower surface of the phosphor layer 162 may have a concavo-convex shape extending along the protrusions 112, and a top surface of the phosphor layer 162 may have a flat shape and/or a concavo-convex shape.

The phosphor layer 162 can be formed only on the top surface of the substrate 111 or can be additionally formed on the lateral sides of the substrate 111 and the light emitting structure 120, although embodiments are not limited thereto.

Figure 13:
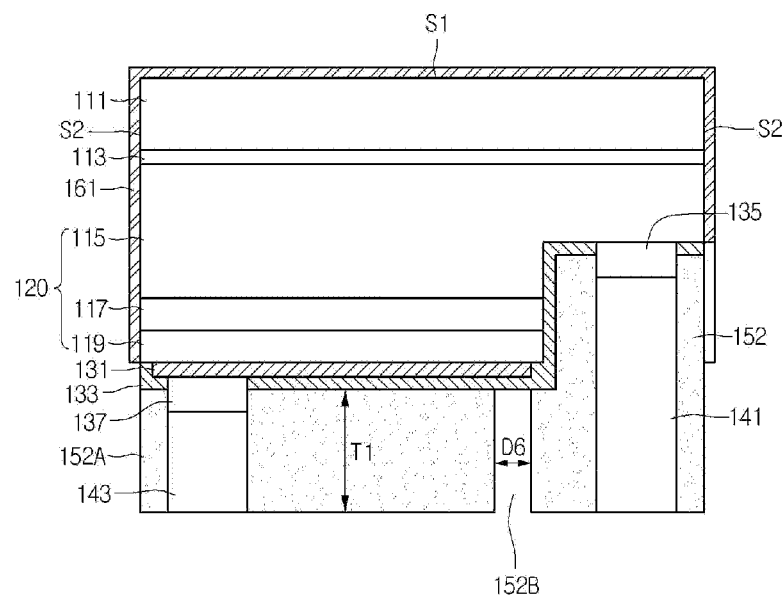
FIGS. 13 and 14 are a side sectional view and a bottom view of a light emitting device according to a fourth embodiment, respectively.
Figure 14:
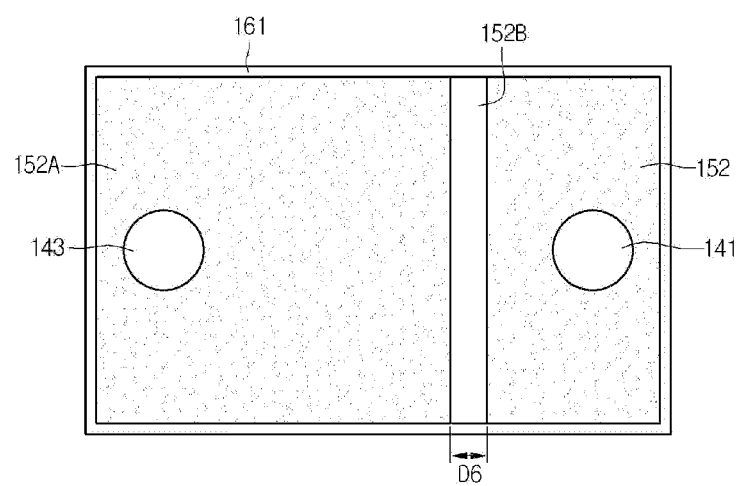

FIG. 13 is a view showing a light emitting device according to a fourth embodiment. FIG. 14 is a bottom view of FIG. 13. Other embodiments and configurations may also be provided.

Referring to FIGS. 13 and 14, a division slot 152B is formed between support members 152 and 152A. The division slot 152B divides the support members 152 and 152A from each other. The first support member 152 is disposed under one side of the light emitting structure 120 around the first connection electrode 141. The second support member 152A is disposed under the other side of the light emitting structure 120 around the second connection electrode 143.

The division slot 152B may physically and electrically separate the first support member 152 from the second support member 152A and may expose the insulating layer 133 formed under the division slot 152B.

The first and second support members 152 and 152A may include the insulating material or the conductive material. The insulating material may include a resin material having the thermal diffuser. The conductive material may include carbon, SiC and/or a metal. If the first and second support members 152 and 152A include the conductive material, the first and second electrodes 141 and 142 include materials different from the conductive material.

Since the first and second support members 152 and 152A including the conductive material are separated from each other by the division slot 152B, an electric short can be prevented.

The division slot 152B may have a width D6 corresponding to a distance between the first and second support members 152 and 152A, and a depth corresponding to the height T1 of the second support member 152A. The division slot 152B may prevent an electric interference between the first and second support members 152 and 152A.

The lower surfaces of the first and second support members 152 and 152A may be aligned on a same plane with the lower surfaces of the first and second connection electrodes 141 and 143. The first and second support members 152 and 152A can be mounted through the first and second connection electrodes 141 and 143 even when the first and second support members 152 and 152A include the conductive materials.

An insulating material including a ceramic material can be further disposed between first and second support members 152 and 152A. In this example, the ceramic material is aligned on a same plane (i.e., a horizontal plane) with the lower surfaces of the first and second support members 152 and 152A.

Figure 15:
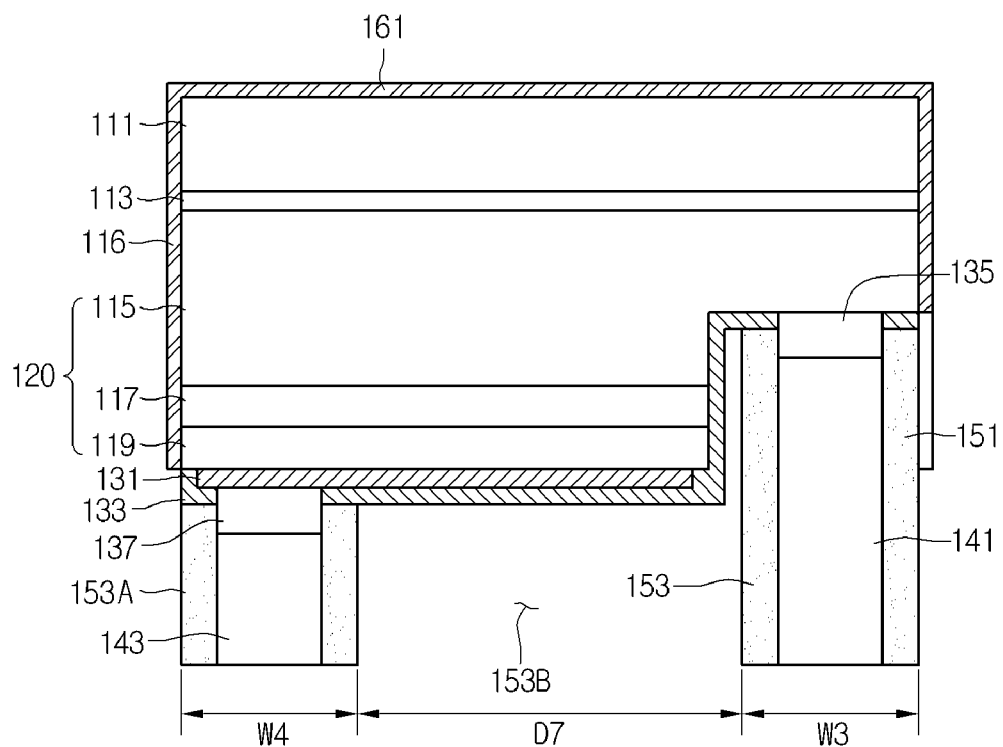
FIGS. 15 and 16 are a side sectional view and a bottom view of a light emitting device according to a fifth embodiment, respectively.
Figure 16:
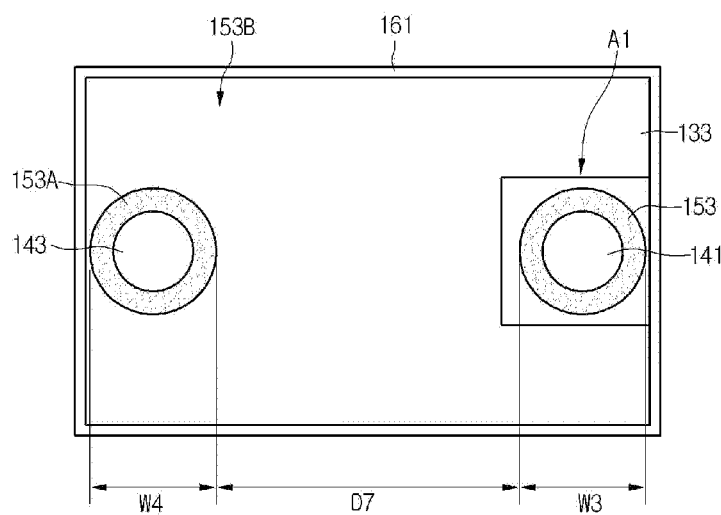

FIG. 15 is a view showing a light emitting device according to a fifth embodiment. FIG. 16 is a bottom view of FIG. 15. Other embodiments and configurations may also be provided.

Referring to FIGS. 15 and 16, the light emitting device may include a plurality of support members 153 and 153A aligned around the first and second connection electrodes 141 and 143. A peripheral portion of the first connection electrode 141 may be covered with the first support member 153 and a peripheral portion of the second connection electrode 143 may be covered with the second support member 153A. The first and second support members 153 and 153A may include insulating materials or conductive materials.

A width W3 of the first support member 153 may be wider than a width of the first connection electrode 141, so that the first support member 153 may serve as a thermal and electrical conductive path. A width W4 of the second support member 153A may be wider than a width of the second connection electrode 143, so that the second support member 153A may serve as a thermal and electrical conductive path.

A distance D7 between the first and second support members 153 and 153A is at least ½ of a length of one lateral side of the light emitting structure 120.

An insulating material including a ceramic material can be further provided between first and second support members 153 and 153A. In this example, the ceramic material may be aligned on a same plane (i.e., a horizontal plane) with the lower surfaces of the first and second support members 153 and 153A.

Figure 17:
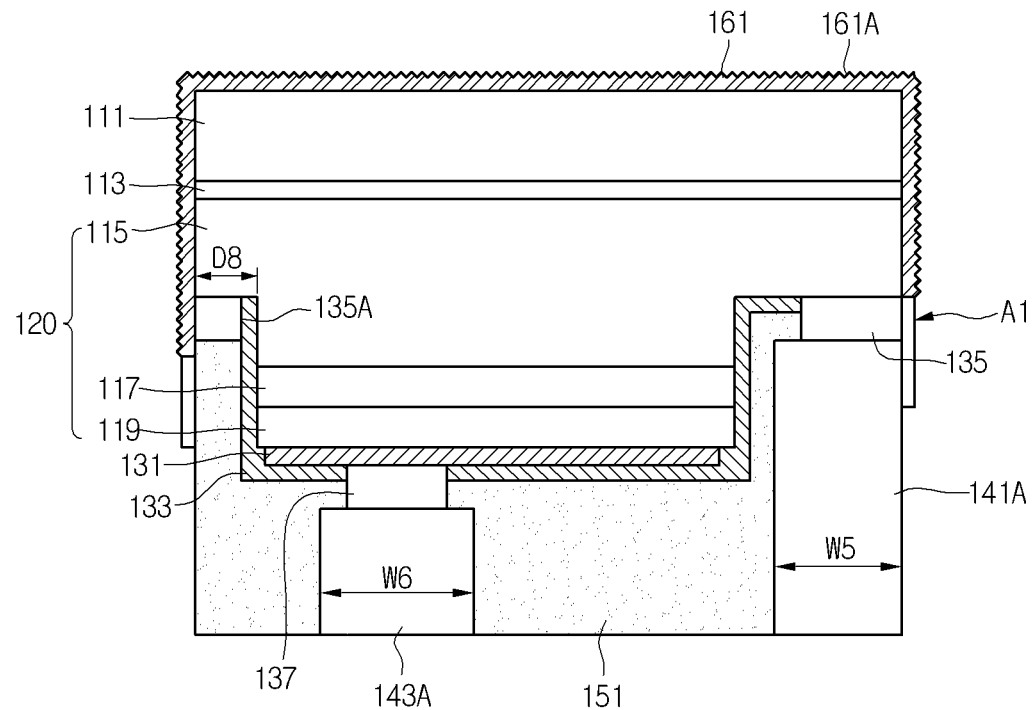
FIG. 17 is a side sectional view of a light emitting device according to a sixth embodiment.

FIG. 17 is a side sectional view showing a light emitting device according to a sixth embodiment. Other embodiments and configurations may also be provided.

Referring to FIG. 17, a width W5 of a first connection electrode 141A may be wider than a width of the first electrode 135 and lateral sides of the first connection electrode 141A and the first electrode 135 may be aligned on a same plane with the lateral sides of the light emitting structure 120 and the substrate 111. The predetermined region A1 of the light emitting structure 120 may be etched such that the etch region of the first conductive semiconductor layer 115 can be exposed. An edge region of the light emitting structure 120 may be spaced apart from the lateral side of the light emitting structure 120 by a predetermined distance D8 along the edge region of the first conductive semiconductor layer 115 and may be formed in a loop shape. A part 135A of the first electrode 135 is formed in a loop shape along the edge region of the first conductive semiconductor layer 115. The loop shape may include an open loop shape or a closed loop shape.

A width W6 of a second connection electrode 143A may be wider than a width of the second electrode 137.

The light extracting structure, such as roughness, may be formed on a surface 161A of the phosphor layer 161.

Figure 18:
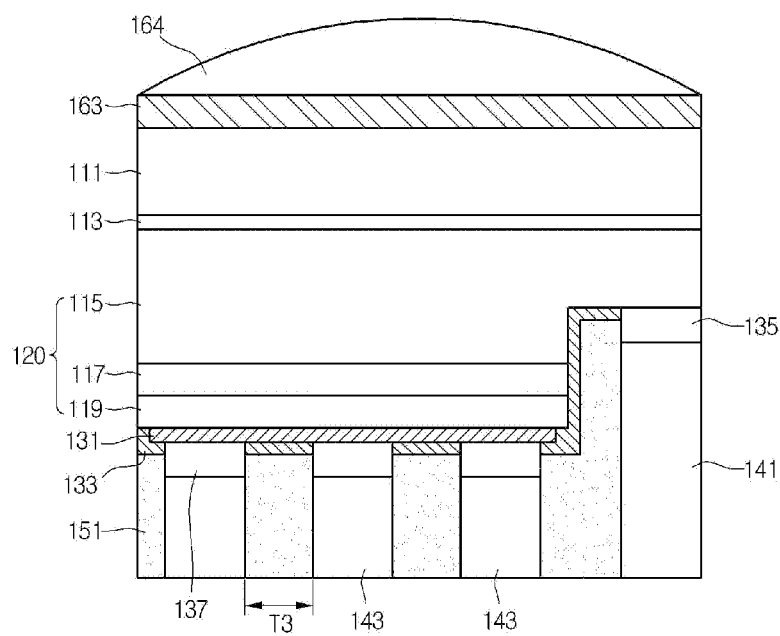
FIG. 18 is a side sectional view of a light emitting device according to a seventh embodiment.

FIG. 18 is a side sectional view showing a light emitting device according to a seventh embodiment. Other embodiments and configurations may also be provided.

Referring to FIG. 18, a phosphor layer 163 may be formed on the top surface of the substrate 111, and a lens 164 may be formed on the phosphor layer 163. The phosphor layer 163 is formed on the top surface of the substrate 111 with a predetermined thickness and the lens 164 formed on the phosphor layer 163 has a convex lens shape. The lens 164 may also have a concave lens shape or an aspheric lens shape having a concavo-convex pattern, although embodiments are not limited thereto.

A plurality of second electrodes 137 are formed under the reflective electrode layer 131, and second connection electrodes 143 are aligned under the second electrodes 137. The second connection electrodes 143 are spaced apart from each other at a predetermined interval T3. When viewed from the bottom of the light emitting device, the second connection electrodes 143 are aligned in the form of a dot matrix. The support members 151 are disposed between first and second connection electrodes 141 and 143 and between the second connection electrodes 143 to serve as an insulating support layer. Since the second connection electrodes 143 are disposed under the light emitting structure, a strength of the support member 151 can be reinforced and an electric contact efficiency can be improved. Additionally, a bonding defect can be prevented from occurring at the second connection electrode 143 of the light emitting device. A plurality of the first connection electrodes 141 can be provided, although embodiments are not limited thereto.

Figure 19:
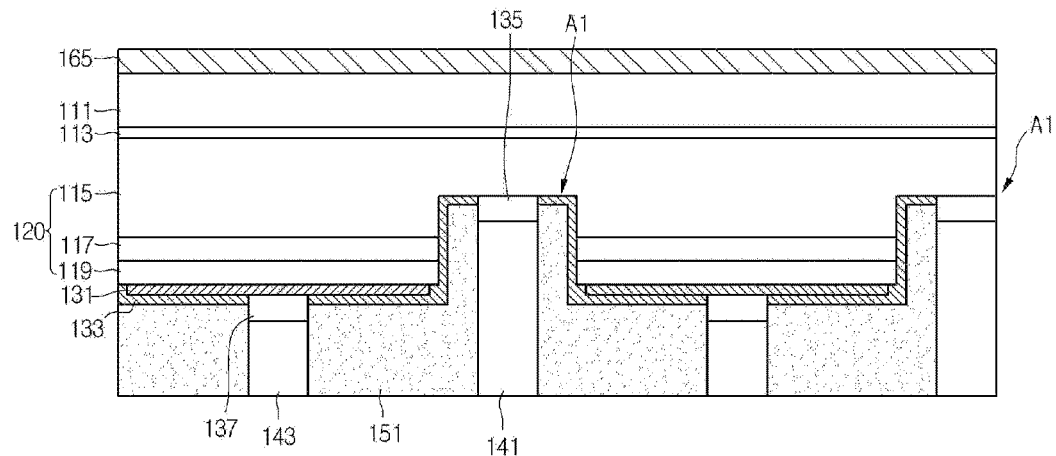
FIG. 19 is a side sectional view of a light emitting device according to an eighth embodiment.

FIG. 19 is a side sectional view showing a light emitting device according to an eighth embodiment. Other embodiments and configurations may also be provided.

Referring to FIG. 19, predetermined regions A1 of the light emitting structure 120 are etching regions to expose the first conductive semiconductor layer 115 at various regions. The first electrodes 135 are disposed under the first conductive semiconductor layer 115, and the second electrodes 137 are disposed under the reflective electrode layer 131. Since the first and second electrodes 135 and 137 are alternately aligned, a current may be uniformly supplied. A phosphor layer 165 may be formed on the top surface of the substrate 111. The light emitting structure 120 may be defined by a plurality of cells, so that brightness can be improved.

Figure 20:
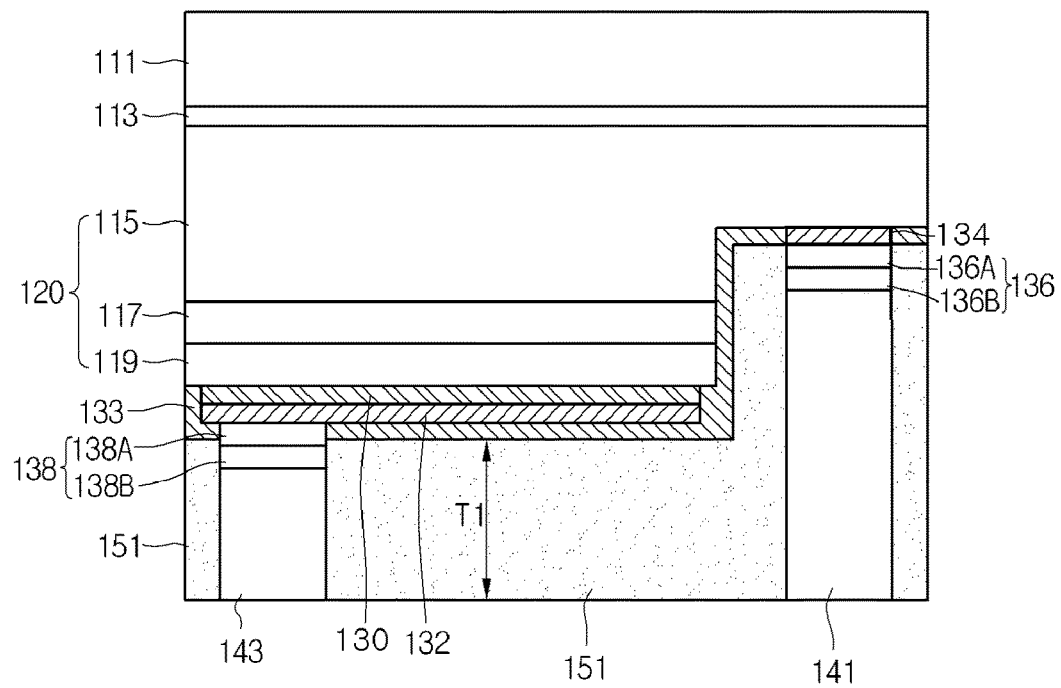
FIG. 20 is a side sectional view of a light emitting device according to a ninth embodiment.

FIG. 20 is a side sectional view showing a light emitting device according to a ninth embodiment. Other embodiments and configurations may also be provided. In the following description, same reference numerals may be assigned to elements and structures that have been described in the first embodiment and detailed description thereof may be omitted in order to avoid redundancy.

Referring to FIG. 20, the reflective electrode layer 130 and the second electrode pad 132 are disposed under the light emitting structure 120, and the reflective electrode layer 130 may serve as an ohmic and reflective electrode under the second conductive semiconductor layer 119. The second electrode pad 132 may have a layered shape or a pattern shape.

A first electrode pad 134 may be provided under the first conductive semiconductor layer 115. The first electrode pad 134 may contact the first conductive semiconductor layer 115 and/or may be bonded between a first electrode bonding layer 136 and the first conductive semiconductor layer 115. The first electrode bonding layer 136 may be bonded between the first electrode pad 134 and the first connection electrode 141 to electrically connect the first electrode pad 134 with the first connection electrode 141. The first electrode bonding layer 136 may include a first bonding electrode 136A and a second bonding electrode 136B under the first bonding electrode 136A. The first bonding electrode 136A may be bonded to the first electrode pad 134 and the second bonding electrode 136B may be bonded between the first connection electrode 141 and the first bonding electrode 136A.

The first electrode pad 134 has a structure with a material and a thickness the same as those of the stack structure of the second electrode pad 132, which may be described below. For example, the first and second electrode pads 134 and 132 may include an adhesive layer, a reflective layer under the adhesive layer, a diffusion barrier layer under the reflective layer, and/or a bonding layer under the diffusion barrier layer. The first electrode bonding layer 136 is bonded between the first connection electrode 141 and the first electrode pad 134 to improve a bonding property between the first connection electrode 141 and the first electrode pad 134.

The first bonding electrode 136A of the first electrode bonding layer 136 is bonded with the second bonding electrode 136B bonded to the first connection electrode 141, so that a physical bonding and electrical connection property of the first connection electrode 141 may be improved.

The reflective electrode layer 130 may be formed under the second conductive semiconductor layer 119, and the second electrode pad 132 may be formed under the reflective electrode layer 130. A lower surface area of the reflective electrode layer 130 may be equal to or smaller than a top surface area of the second electrode pad 132, although embodiments are not limited thereto. A second electrode bonding layer 138 may be formed between the second electrode pad 132 and the second connection electrode 143 to improve a bonding strength between the second electrode pad 132 and the second connection electrode 143.

The second electrode bonding layer 138 may connect the second electrode pad 132 with the second connection electrode 143. The second electrode bonding layer 138 may include a third bonding electrode 138A and a fourth bonding electrode 138B under the third bonding electrode 138A. The third bonding electrode 138A is bonded to the second electrode pad 132, and the fourth bonding electrode 138B is bonded between the second connection electrode 143 and the third bonding electrode 138A.

The second electrode bonding layer 138 is bonded between the second connection electrode 143 and the second electrode pad 132 to improve a bonding property between the second connection electrode 143 and the second electrode pad 132. The first electrode pad 134 may serve as a first electrode and the second electrode pad 132 serves as a second electrode.

Figure 21:
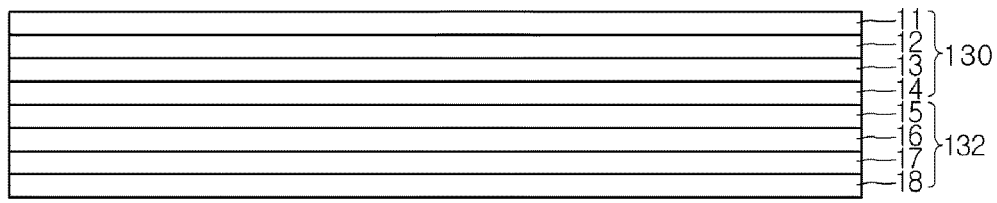
FIG. 21 is a view showing an example of a reflective electrode layer and a second electrode pad of FIG. 20.

FIG. 21 is a view showing an example of the reflective electrode layer and the second electrode pad of FIG. 20.

Referring to FIG. 21, the reflective electrode layer 130 may include an ohmic contact layer 11, a reflective layer 12 under the ohmic contact layer 11, a diffusion barrier layer 13 under the reflective layer 12, and a protective layer 14 under the diffusion barrier layer 13.

The ohmic contact layer 11 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, RuOx, NiO, Ni, Cr and/or an alloy including at least two of the above elements. The ohmic contact layer 11 may include at least one layer and may have a thickness of approximately 1 to 1,000 Å.

The reflective layer 12 formed under the ohmic contact layer 11 may include a material having reflectivity of approximately 70% or greater. For example, the reflective layer 12 may include one selected from the group consisting of Al, Ag, Ru, Pd, Rh, Pt, Ir and/or an alloy having at least two of the above elements. A metal of the reflective layer 12 makes ohmic-contact with the lower surface of the second conductive semiconductor layer. In this case, the ohmic contact layer 11 can be omitted. The reflective layer 12 may have a thickness of approximately 1 to 10,000 Å.

The diffusion barrier layer 13 may include one selected from the group consisting of Au, Cu, Hf, Ni, Mo, V, W, Rh, Ru, Pt, Pd, La, Ta, Ti and/or an alloy having at least two of the above elements. The diffusion barrier layer 13 may prevent an interlayer diffusion at the boundary region between two different layers. The diffusion barrier layer 13 may have a thickness of approximately 1 to 10,000 Å.

The protective layer 14 may include one selected from the group consisting of Au, Cu, Hf, Ni, Mo, V, W, Rh, Ru, Pt, Pd, La, Ta, Ti and/or an alloy having at least two of the above elements. The protective layer 14 may have a thickness of approximately 1 to 10,000 Å. The reflective electrode layer 130 may not include at least one of the ohmic contact layer 11, the diffusion barrier layer 13 and/or the protective layer 14.

The second electrode pad 132 may include an adhesive layer 15, a reflective layer 16 under the adhesive layer 15, a diffusion barrier layer 17 under the reflective layer 16 and a bonding layer 18 under the diffusion barrier layer 17. The adhesive layer 15 is bonded to the reflective electrode layer 130 and may include one selected from the group consisting of Cr, Ti, Co, Ni, V, Hf and/or an alloy thereof. The adhesive layer 15 has a thickness of approximately 1 to 1,000 Å. The reflective layer 16 is formed under the adhesive layer 15 and may include one selected from the group consisting of Ag, Al, Ru, Rh, Pt, Pd and an alloy thereof. The reflective layer 16 has a thickness of approximately 1 to 10,000 Å. The diffusion barrier layer 17 is formed under the reflective layer 16 and may include one selected from the group consisting of Ni, Mo, W, Ru, Pt, Pd, La, Ta, Ti and/or an alloy thereof. The diffusion barrier layer 17 has a thickness of approximately 1 to 10,000 Å. The bonding layer 18 may include one selected from the group consisting of Al, Au, Cu, Hf, Pd, Ru, Rh, Pt and/or an alloy thereof. The bonding layer 18 has a thickness of approximately 1 to 10,000 Å. The second electrode pad 132 may not include the reflective layer 16.

At least one of the reflective electrode layer 130 and the second electrode pad 132 can be applied to the reflective electrode layer and the second electrode pad shown in FIG. 1 and/or may be disclosed in other embodiments, although embodiments are not limited thereto.

Figure 22:
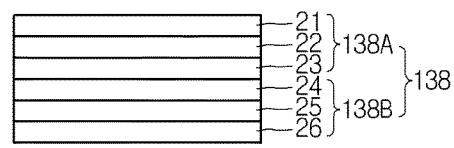
FIG. 22 is a view showing an example of a second electrode bonding layer of FIG. 20.

FIG. 22 is a view showing an example of the second electrode bonding layer of FIG. 20.

Referring to FIG. 22, the second electrode bonding layer 138 includes a third bonding electrode 138A and a fourth bonding electrode 138B, in which the third bonding electrode 138A includes at least three metal layers. The third bonding electrode 138A includes an adhesive layer 21, a support layer 22 under the adhesive layer 21, and a protective layer 23 under the support layer 22. The adhesive layer 21 is bonded to the second electrode pad and may include one selected from the group consisting of Cr, Ti, Co, Cu, Ni, V, Hf and/or an alloy including at least two of the above elements. The adhesive layer 21 has a thickness of 1~1,000 Å. The support layer 22 is thicker than the adhesive layer 21 and may include one selected from the group consisting of Ag, Al, Au, Co, Cu, Hf, Mo, Ni, Ru, Rh, Pt, Pd and/or an alloy including at least two of the above elements. The support layer 22 has a thickness of 1~500,000 Å or 1,000~100,000 Å. The protective layer 23 protects the first conductive semiconductor layer from external influence and may include one selected from the group consisting of Au, Cu, Ni, Hf, Mo, V, W, Rh, Ru, Pt, Pd, La, Ta, Ti and/or an alloy including at least two of the above elements. The protective layer 23 has a thickness of 1~50,000 Å.

The adhesive layer 21 and the support layer 22 of the third bonding electrode 138A may be repeatedly stacked by at least one periodicity.

The fourth bonding electrode 138B may include at least three metal layers. The fourth bonding electrode 138B may include an adhesive layer 24, a diffusion barrier layer 25 under the adhesive layer 24, and a bonding layer 26 under the diffusion barrier layer 25. The adhesive layer 24 is bonded to the third bonding electrode 138A and may include one selected from the group consisting of Cr, Ti, Co, Ni, V, Hf and/or an alloy including at least two of the above elements. The adhesive layer 24 has a thickness of 1~1,000 Å. The diffusion barrier layer 25 may prevent an interlayer diffusion and may include one selected from the group consisting of Ni, Mo, Hf, W, Ru, Pt, Pd, La, Ta, Ti and/or an alloy including at least two of the above elements. The diffusion barrier layer 25 has a thickness of 1~10,000 Å. The bonding layer 26 is bonded to the first connection electrode and may include one selected from the group consisting of Au, Cu, Ni, Hf, Mo, V, W, Rh, Ru, Pt, Pd, La, Ta, Ti and/or an alloy including at least two of the above elements. The bonding layer 26 has a thickness of 1~10,000 Å. The adhesive layer 24 and the diffusion barrier layer 26 of the fourth bonding electrode 138B may be repeatedly stacked by at least one periodicity. The structure of the second electrode bonding layer shown in FIG. 22 can be applied to the electrode shown in FIG. 1 or may be disclosed in other embodiments, although embodiments are not limited thereto.

Figure 23:
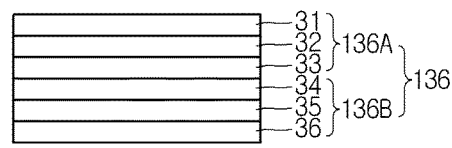
FIG. 23 is a view showing an example of a first electrode bonding layer of FIG. 20.

FIG. 23 is a view showing an example of the first electrode bonding layer of FIG. 20.

Figure 25:
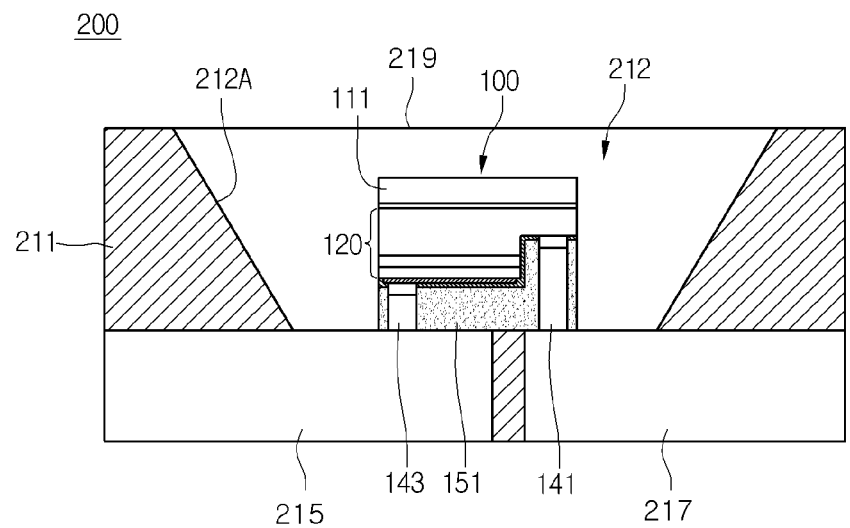
FIG. 25 is a view showing a light emitting device package having the light emitting device of FIG. 1.

Referring to FIG. 23, the first electrode bonding layer 136 may include a first bonding electrode 136A and a second bonding electrode 136B, in which the first bonding electrode 136A includes a metal layer the same as that of the third bonding layer 138A (shown in FIG. 25) and the second bonding electrode 136B includes a metal layer the same as that of the fourth bonding layer 138B (shown in FIG. 25). Thus, the first bonding electrode 136A is disposed between the first electrode pad and the second bonding electrode 136B, and the second bonding electrode 136B is disposed between the first bonding electrode 136A and the first connection electrode 141. The stack structure of the first and second bonding electrodes 136A and 136B may be referred to the stack structure of the third and fourth bonding electrodes shown in FIG. 22. The structure of the first electrode bonding layer shown in FIG. 23 can be applied to the electrode shown in FIG. 1 or may be disclosed in other embodiments, although embodiments are not limited thereto.

Figure 24:
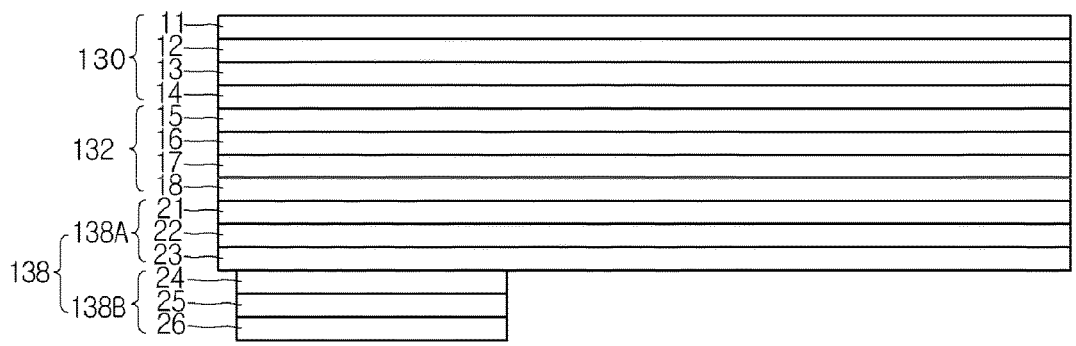
FIG. 24 is a view showing an example of a second electrode bonding layer of FIG. 20.

FIG. 24 is a view showing an example of the second electrode bonding layer of FIG. 20.

Referring to FIGS. 20 and 24, a top surface area of the third bonding electrode 138A of the second electrode bonding layer 138 may be equal to a lower surface area of the second electrode pad 132. The top surface area of the third bonding electrode 138A of the second electrode bonding layer 138 may be larger than the top surface area of the fourth bonding electrode 138B, and may equal to or smaller than the lower surface area of the second electrode. The structure of the second electrode pad and the second electrode bonding layer shown in FIG. 24 can be applied to the electrode shown in FIG. 1 or may be disclosed in other embodiments, although embodiments are not limited thereto.

FIG. 25 is a view showing a light emitting device package having the light emitting device of FIG. 1.

Referring to FIG. 25, the light emitting device package 200 may include a body 211, first and second lead electrodes 215 and 217 installed in the body 211, a molding member 219 and the light emitting device 100.

The body 211 may be injection molded by using one of a high reflective resin (e.g. PPA), a polymeric material or a plastic material, and may be prepared as a substrate having a single layer or as multiple layers. The body 211 may include a cavity 212 having an open top surface, in which a sidewall of the cavity 212 is inclined or vertical to a lower surface of the cavity 212.

The first and second lead electrodes 215 and 217 may be provided in the cavity 212 such that the first and second lead electrodes 215 and 217 are spaced apart from each other.

The light emitting device 100 is bonded to the first and second lead electrodes 215 and 217 through the flip scheme. The first connection electrode 141 (of the light emitting device 100) is bonded to the first lead electrode 215 and the second connection electrode 143 (of the light emitting device 100) is bonded to the second lead electrode 217.

The distance between the top surface of the first lead electrode 215 and the lower surface of the light emitting device 100 (e.g., the lower surfaces of the first connection electrode 141, the second connection electrode 143 and the support member 151) may be equal to the distance between the top surface of the second lead electrode 217 and the lower surface of the light emitting device 100.

The support member 151 is formed on the first lead electrode 215 and the second lead electrode 217 to dissipate heat through the entire surface of the support member 151.

The molding member 219 may be formed in the cavity 212. The molding member 219 includes a transmittive resin material, such as silicon or epoxy. The molding member 219 may further include a luminescence material.

Most of the light generated from the light emitting device 100 is extracted through the top surface and the lateral sides of the light emitting device 100 and the extracted light is dissipated to the outside through the molding member 217.

One or a plurality of light emitting devices 100 can be mounted in the light emitting device package 200, although embodiments are not limited thereto. If the light emitting device having the luminescence layer (or phosphor layer) is mounted in the light emitting device package, the luminescence material may not be added to the molding member 217. Additionally, various luminescence materials different from each other or luminescence materials emitting similar colors can be added to the molding member 217.

Figure 26:
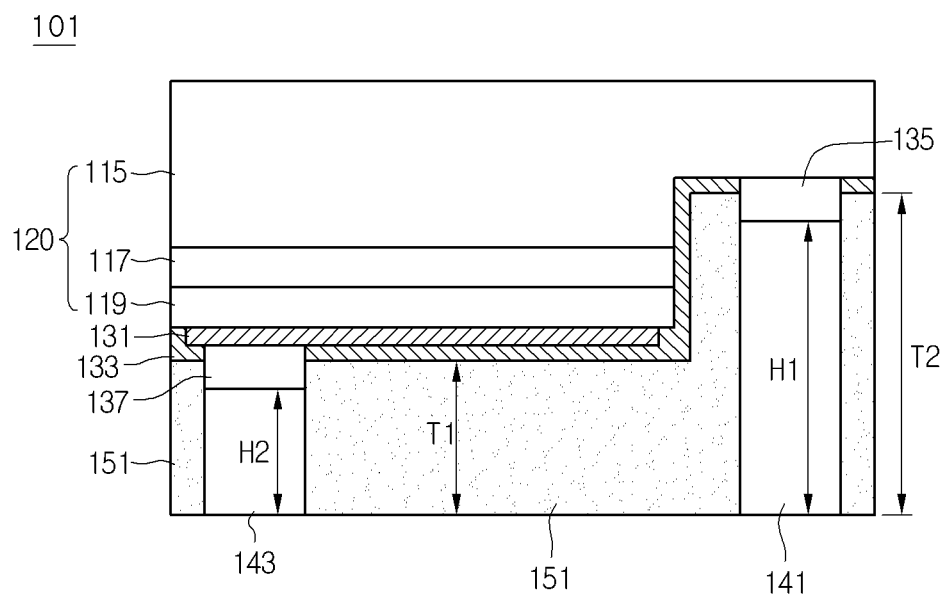
FIG. 26 is a side sectional view of a light emitting device according to a tenth embodiment.
Figure 27:
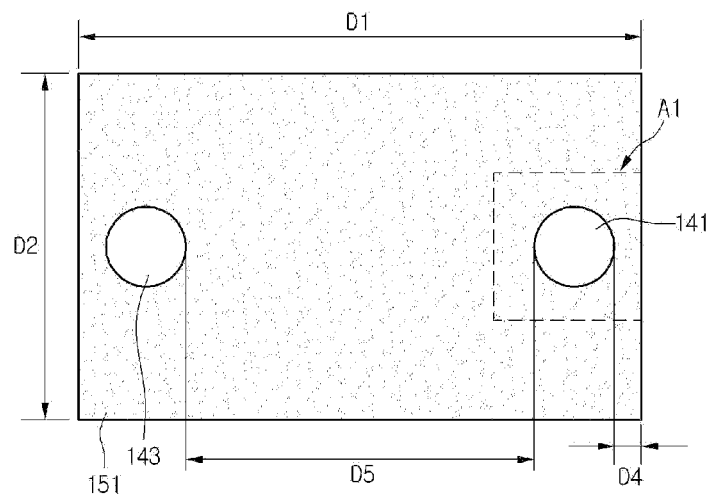
FIG. 27 is a bottom view of a light emitting device shown in FIG. 26.

FIG. 26 is a side sectional view of a light emitting device according to a tenth embodiment. FIG. 27 is a bottom view of the light emitting device shown in FIG. 26. Other embodiments and configurations may also be provided.

Referring to FIGS. 26 and 27, a light emitting device 101 may include a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143 and a support member 151.

The top surface of the light emitting device 101 may be the top surface of the first conductive semiconductor layer 115 and the lower surface of the light emitting device 101 may be the lower surface of the support member 151. The top surface of the first conductive semiconductor layer 115 is opposite to the lower surface of the support member 151.

The light emitting structure 120 can be defined by the first conductive semiconductor layer 115, the second conductive semiconductor layer 119, and the active layer 117. The light emitting structure 120 includes the group III-V compound semiconductor. For example, the light emitting structure 120 includes the semiconductor having the compositional formula of $In_xAl_yGa_{1-x-y}N$ ($0 \le x \le 1$, $0 \le y \le 1$, $0 \le x+y \le 1$) and may emit the light having a predetermined peak wavelength in the wavelength range of an ultraviolet ray band to a visible ray band.

The light emitting structure 120 (of the light emitting device 101) may be defined by the first conductive semiconductor layer 115, the active layer 117 and the second conductive semiconductor layer 119. The light emitting structure 120 may have one of an N-P junction structure, a P-N junction structure, an N-P-N junction structure, and/or a P-N-P junction structure. In this example, the symbols "N" and "P" represent N and P type semiconductor layers, respectively, and the symbol "-" represents that two layers are directly or indirectly stacked on each other. The second conductive semiconductor layer 119 may hereinafter be referred to as the uppermost layer of the light emitting structure 120 for ease of explanation.

The light emitting device 101 may be obtained by removing the substrate 111 from the light emitting device 100 shown in FIG. 1. That is, the top surface of the first conductive semiconductor layer 115 is provided at the top side of the light emitting device 101.

The reflective electrode layer 131 is formed under the second conductive semiconductor layer 119. The reflective electrode layer 131 may include at least one of an ohmic contact layer, a reflective layer, a diffusion barrier layer and/or a protective layer.

The reflective electrode layer 131 may include the structure of the ohmic contact layer/reflective layer/diffusion barrier layer/protective layer, the reflective layer/diffusion barrier layer/protective layer, the ohmic contact layer/reflective layer/protective layer, the reflective layer/diffusion barrier, and/or the reflective layer.

The reflective electrode layer 131 may include the stack structure of a transmittive electrode layer/a reflective layer. The reflective electrode layer 131 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, and/or RuOx. The reflective layer may be formed under the transmittive electrode layer. The reflective layer may include a first layer having a first refractive index and a second layer having a second refractive index. The reflective layer may include the stack structure in which at least two pairs of the first and second layers are alternately stacked. The first refractive index is different from the second refractive index and the first and second layers may include a material having the refractive index in the range of 1.5 to 2.4. For example, the first and second layers may include a conductive material or an insulating material. Such a structure may be defined as a DBR (distributed bragg reflection) structure.

A light extracting structure, such as a roughness, may be formed on a surface of at least one of the second conductive semiconductor layer 119 and/or the reflective electrode layer 131. The light extracting structure may change a critical angle of an incident layer to improve light extraction efficiency.

The first and second connection electrodes 141 and 143 may serve as a lead for supplying power and a heat dissipation path. The first and second connection electrodes 141 and 143 may have a column shape. For example, the first and second connection electrodes 141 and 143 may have a spherical shape, a cylindrical shape, a polygonal column shape and/or a random shape. The polygonal column shape may be an equiangular column shape or not, although embodiments are not limited thereto. The top and lower surfaces of the first and second connection electrodes 141 and 143 may have a circular shape or a polygonal shape, although embodiments are not limited thereto. The lower surface area of the first and second connection electrodes 141 and 143 may be different from the top surface area of the first and second connection electrodes 141 and 143. For example, the lower surface area of the first and second connection electrodes 141 and 143 may be larger or smaller than the top surface area of the first and second connection electrodes 141 and 143.

One of the first and second connection electrodes 141 and 143 may be smaller than a width of a lower surface of the light emitting structure 120, and may be larger than a diameter or a width of a lower surface of the first and second electrodes 135 and 137.

The diameter or the width of the first and second connection electrodes 141 and 143 may be in the range of 1 μm~100,000 μm, and the height of first and second connection electrodes 141 and 143 may be in the range of 1 μm~100,000 μm. The height H1 of the first connection electrode 141 may be greater than the height H2 of the second connection electrode 143, and lower surfaces of the first and second connection electrodes 141 and 143 may be aligned on a same plane (i.e., a horizontal plane).

The first and second connection electrodes 141 and 143 may be prepared as a single layer by using one metal or an alloy. The width and the height of the single layer is in the range of 1 μm~100,000 μm. For example, the single layer may have the thickness larger than the thickness of the second connection electrode 143.

The first and second connection electrodes 141 and 143 may include one selected from the group consisting of Ag, Al, Au, Cr, Co, Cu, Fe, Hf, In, Mo, Ni, Si, Sn, Ta, Ti, W and/or an alloy thereof. In order to improve a adhesive strength with respect to the first and second electrodes 135 and 137, the first and second connection electrodes 141 and 143 may be plated with a metal including one selected from the group consisting of In, Sn, Ni, Cu and/or an alloy thereof. The plating thickness may be in the range of 1~100,000 Å.

A plating layer can be further formed on the surfaces of the first and second connection electrodes 141 and 143. The plating layer may include Tin or an alloy thereof, Ni or an alloy thereof, and/or Tin-Ag—Cu. The plating layer may have a thickness of approximately 0.5 μm~10 μm. The plating layer can improve a bonding strength with respect to other bonding layers.

The insulating layer 133 may be formed under the reflective electrode layer 131. The insulating layer 133 can be formed on the lower surface of the second conductive semiconductor layer 119, lateral sides of the second conductive semiconductor layer 119 and the active layer 117, and the lower surface of the predetermined region A1 of the first conductive semiconductor layer 115. The insulating layer 133 is formed on the lower region of the light emitting structure 120 except for the region for the reflective electrode layer 131, the first electrode 135 and the second electrode 137 to electrically protect the lower portion of the light emitting structure 120.

The insulating layer 133 may include an insulating material or an insulating resin formed by using oxide, nitride, fluoride or sulfide including at least one of Al, Cr, Si, Ti, Zn and/or Zr. For example, the insulating layer 133 may include one selected from the group consisting of $SiO_2$, $Si_3N_4$, $Al_2O_3$ and/or $TiO_2$. The insulating layer 133 may be prepared as a single layer or as multiple layers, although embodiments are not limited thereto. The insulating layer 133 may prevent a short between layers of the light emitting structure 120 when a metal structure is formed under the light emitting structure for the purpose of flip bonding.

The insulating layer 133 may be formed only on a surface of the light emitting structure 120 without being formed on the lower surface of the reflective electrode layer 131. Since the support member 151 having the insulating property is formed on the lower surface of the reflective electrode layer 131, the insulating layer 133 may not need to extend to the lower surface of the reflective electrode layer 131.

The insulating layer 133 has the DBR structure in which the first and second layers having refractive indexes different from each other are alternately aligned. The first layer may include one of $SiO_2$, $Si_3N_4$, $Al_2O_3$, and/or $TiO_2$, and the second layer may include materials except for the materials of the first layer.

The insulating layer 133 may have the thickness in the range of 100 to 10,000 Å. If the insulating layer 133 is prepared as the multiple layers, each layer may have the thickness in the range of 1 to 50,000 Å or 100 to 10,000 Å. The thickness of each layer of the insulating layer 133 having the multiple layers may change the reflective efficiency according to the emission wavelength. The reflective electrode layer may be omitted in this example.

The first and second connection electrodes 141 and 143 may include Ag, Al, Au, Cr, Co, Cu, Fe, Hf, In, Mo, Ni, Si, Sn, Ta, Ti, W and/or an alloy thereof. Additionally, the first and second connection electrodes 141 and 143 may have a plating layer including In, Sn, Ni, Cu and/or an alloy thereof to improve an adhesive strength with respect to the first and second electrodes 135 and 137. In this example, the plating layer has the thickness in the range of 1~100,000 Å. The first and second connection electrodes 141 and 143 may be used as a single metal, such as a solder ball or a metal bump, although embodiments are not limited thereto.

The support member 151 may serve as a support layer to support the light emitting device 100. The support member 151 may include an insulating material. For example, the insulating material may be a resin that includes silicon or epoxy. Additionally, the insulating material may include paste or insulating ink. The insulating material may also include a resin selected from the group consisting of a polyacrylate resin, an epoxy resin, a phenolic resin, a polyamides resin, a polyimide resin, an unsaturated polyesters resin, a polyphenylene ether resin (PPE), a polyphenylene oxide resin (PPO), a polyphenylene sulfides resin, a cyanate ester resin, benzocyclobutene (BCB), Polyamidoamine Dendrimers (PAMAM), Polypropylene-imine, Dendrimers (PPI), PAMAM-OS (organosilicon) having an internal structure of PAMAM and an outer surface of organosilicon, and/or a combination thereof. The material for the support member 151 may be different from the material for the insulating layer 133.

At least one of compounds, such as oxide, nitride, fluoride or sulfide including at least one of Al, Cr, Si, Ti, Zn and Zr, can be added to the support member 151. The compound added to the support member 151 may be a thermal diffuser. The thermal diffuser may be a powder particle having a predetermined size, a grain, a filler and/or an additive. In the following, the support member 151 including the thermal diffuser may be described for ease of explanation. The thermal diffuser may include an insulating material or a conductive material having a size of 1 Å~100,000 Å. In order to improve thermal diffusion efficiency, the thermal diffuser may have a size of 1,000 Å~50,000 Å. The grain of the thermal diffuser may have a spherical shape or an irregular shape, although embodiments are not limited thereto.

The thermal diffuser may include a ceramic material. The ceramic material may include at least one of LTCC (low temperature co-fired ceramic), HTCC (high temperature co-fired ceramic), alumina, quartz, calcium zirconate, forsterite, SiC, graphite, fused-silica, mullite, cordierite, zirconia, beryllia, and/or aluminum nitride. The ceramic material may include a metal nitride having a thermal conductivity higher than that of nitride or oxide. For example, the metal nitride may include a material having the thermal conductivity equal to or higher than 140 W/mK. For example, the ceramic material may include one selected from the group consisting of $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and/or AlN. The thermal conductive material may include a C-component, such as diamond or CNT.

The support member 151 can be prepared as a single layer or as multiple layers, although embodiments are not limited thereto. The support member 151 may be provided therein with ceramic powder, so strength and thermal conductivity of the support member 151 can be improved.

Additionally, the amount of the thermal diffuser added to the support member 151 may be 1~99 wt %. In order to improve thermal diffusion efficiency, 50~99 wt % of the thermal diffuser may be added to the support member 151. Since the thermal diffuser is added to the support member 151, the thermal conductivity can be improved at an interior of the support member 151. Additionally, the support member 151 may have the thermal expansion coefficient of 4-11 [$\times 10^6/°$ C.]. The above thermal expansion coefficient may be equal or similar to the thermal expansion coefficient of the sapphire substrate, so the wafer may not be warped or damaged caused by a difference in the thermal expansion coefficient between the support member 151 and the light emitting structure 120 formed on the sapphire substrate, which is the growth substrate, thereby improving reliability of the light emitting device.

The lower surface area of the support member 151 may be substantially equal to the top surface area of the light emitting structure 120, (i.e., the top surface area of the support member 151). Additionally, the lower surface area of the support member 151 may be equal to the top surface area of the first conductive semiconductor layer 115. Referring to FIG. 27, a length D1 of a first lateral side of the support member 151 may be substantially the same as a length of a first lateral side of the light emitting structure 120 (shown in FIG. 26), and a length D2 of a second lateral side of the support member 151 may be substantially the same as a length of a second lateral side of the light emitting structure 120 (shown in FIG. 26). Additionally, a distance D5 between the first and second connection electrodes 141 and 143 may be an interval between two adjacent electrode pads and may correspond to ½ or more with respect to the length of one lateral side of the light emitting device 101.

The lower surface of the support member 151 may be a substantially flat surface or an irregular surface, although embodiments are not limited thereto.

A thickness T1 of the first region of the support member 151 may be thicker than a thickness of the second connection electrode 143. Alternatively, the thickness T1 of the first region of the support member 151 may be thinner than the thickness H2 of the second connection electrode 143. If the thickness of the insulating layer 133 is thicker than the thickness of the second connection electrode 143, the thickness of the support member 151 may become thin. A thickness T2 of the second region of the support member 151 may be thicker than a thickness T2 of the first connection electrode 141. The support member 151 may have the thickness T1 in the range of 1 μm~100,000 μm or 50 μm~1,000 μm.

The lower surface of the support member 151 may be lower than the lower surfaces of the first and second electrodes 135 and 137, and may be aligned on a same plane (i.e., a horizontal plane) with the lower surfaces of the first and second connection electrodes 141 and 143.

The support member 151 may contact outer peripheral surfaces of the first and second electrodes 135 and 137 and the first and second connection electrodes 141 and 143. Thus, heat induced from the first and second electrodes 135 and 137 and the first and second connection electrodes 141 and 143 can be diffused and dissipated through the support member 151. The thermal conductivity of the support member 151 can be improved by the thermal diffuser contained in the support member 151, so that the support member 151 can dissipate the heat through the whole surface of the support member 151. Thus, reliability of the light emitting device 100 can be improved against heat.

Additionally, the lateral sides of the support member 151 can be aligned on the same plane (i.e., the vertical plane) with the lateral sides of the light emitting structure 120 and the substrate 111.

The light emitting device 101 may be mounted through the flip scheme, so most of the light is emitted toward the top surface of the light emitting structure 120 and some light is emitted through the lateral sides of the light emitting structure 120. Thus, the light loss caused by the first and second electrodes 135 and 137 can be reduced. Accordingly, the light extraction efficiency and heat dissipation efficiency of the light emitting device 101 can be improved.

FIGS. 28 to 37 are sectional views showing a manufacturing process for the light emitting device 100 according to an embodiment. Although the following description is made based on the individual device to facilitate explanation, the light emitting device may be manufactured at the wafer level and the individual device may be manufactured through the process described below. However, manufacture of the individual device is not limited to the process described below, but the process operations may be increased or reduced to manufacture the individual device.

Figure 28:
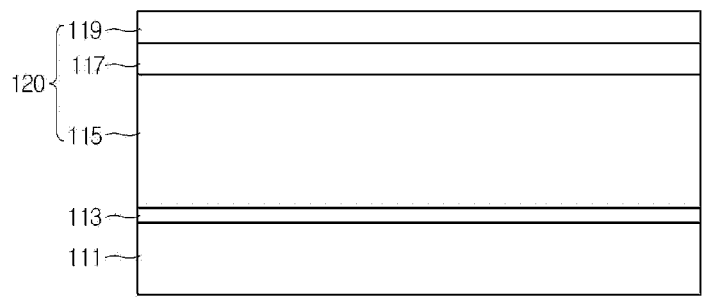
FIGS. 28 to 37 are sectional views showing a manufacturing process for the light emitting device shown in FIG. 26.

Referring to FIG. 28, the substrate 111 may be loaded in growth equipment, and the compound semiconductor including group II to VI elements is formed on the substrate 111 in the form of a layer or a pattern. The substrate 111 may serve as a growth substrate.

The substrate 111 may include a transmittive substrate, an insulating substrate and/or a conductive substrate. For example, the substrate 111 may include one selected from the group consisting of $Al_2O_3$, GaN, SiC, ZnO, Si, GaP, InP, $Ga_2O_3$, and/or GaAs. The substrate 111 may be formed on the top surface thereof with a light extracting structure, such as a concavo-convex pattern. The concavo-convex pattern may change a critical angle of the light, thereby improving the light extraction efficiency.

The first semiconductor layer 113 may be formed on the substrate 111. The first semiconductor layer 113 can be formed by using the compound semiconductor including the group III-V elements. The first semiconductor layer 113 may serve as a buffer layer to reduce a lattice mismatch with respect to the substrate. The first semiconductor layer 113 may be an undoped semiconductor layer including a GaN-based semiconductor, which is not intentionally doped. The first semiconductor layer 113 may be a semiconductor layer doped with the first conductive dopant.

The light emitting structure 120 may be formed on the first semiconductor layer 113. The light emitting structure 120 may include the first conductive semiconductor layer 115, the active layer 117 and the second conductive semiconductor layer 119, which may be sequentially formed.

The light emitting structure 120 may have one of an N-P junction structure, a P-N junction structure, an N-P-N junction structure, and/or a P-N-P junction structure.

The concavo-convex pattern can be formed on a surface of at least one layer of the light emitting structure 120. The concavo-convex pattern may be formed through the wet etching and/or the dry etching, although embodiments are not limited thereto. Since the concavo-convex pattern is formed on the top surface of the second conductive semiconductor layer 119 (of the light emitting structure 120), the light emitting structure 120 can be used as the light extracting structure.

Figure 29:
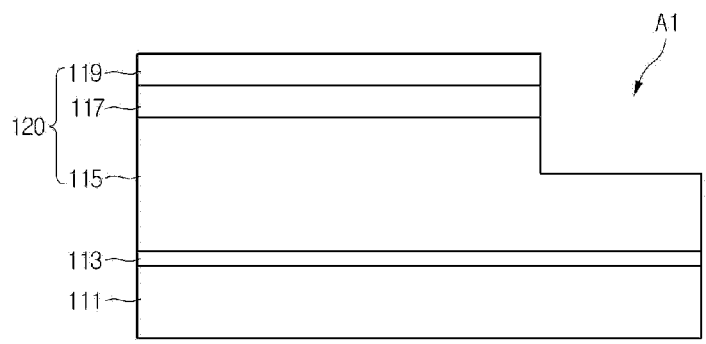

Referring to FIG. 29, the predetermined region A1 of the light emitting structure 120 is etched. The predetermined region A1 of the light emitting structure 120 exposes the first conductive semiconductor layer 115 and the exposed portion of the first conductive semiconductor layer 115 is lower than the top surface of the active layer 117.

Figure 30:
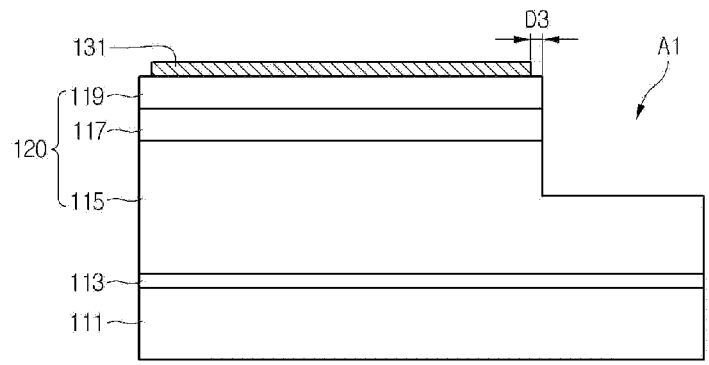

Referring to FIG. 30, the reflective electrode layer 131 is formed on the light emitting structure 120. The reflective electrode layer 131 has an area smaller than a top surface area of the second conductive semiconductor layer 119 to prevent a short when the reflective electrode layer 131 is manufactured. The reflective electrode layer 131 may include a metallic material having reflectivity of at least 70% or 90%.

The reflective electrode layer 131 may include the structure of the ohmic contact layer/reflective layer/diffusion barrier layer/protective layer, the reflective layer/diffusion barrier layer/protective layer, the ohmic contact layer/reflective layer/protective layer, and/or the reflective layer. The description about material and thickness of each layer may be referred to in the description of FIG. 1.

The processes shown in FIGS. 29 and 30 can be interchanged, and embodiments are not limited thereto.

Figure 31:
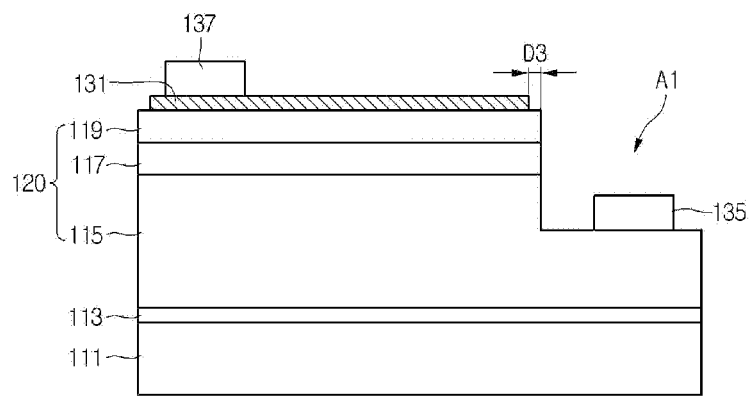

Referring to FIG. 31, the second electrode 137 may be formed on the first reflective electrode layer 131 after forming the first electrode 135 on the first conductive semiconductor layer 115. The first and second electrodes 135 and 137 can be formed by using sputter equipment and/or deposition equipment after masking the region except for the electrode region using the mask, although embodiments are not limited thereto.

Figure 32:
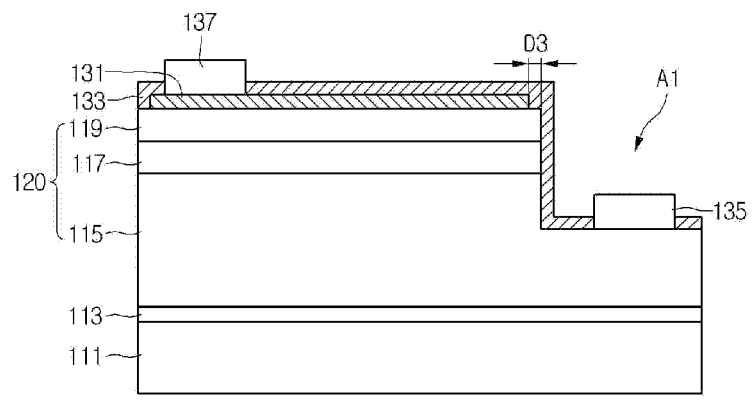

Referring to FIG. 32, the insulating layer 133 may be formed on the reflective electrode layer 131 through the sputtering or deposition process. The insulating layer 133 is formed over the whole area of the reflective electrode layer 131 except for the regions for the first and second electrodes 135 and 137, thereby covering the top surfaces of the reflective electrode layer 131 and the second conductive semiconductor layer 119 and the exposed portion of the first conductive semiconductor layer 115.

The insulating layer 133 may include an insulating material or an insulating resin formed by using oxide, nitride, fluoride or sulfide including Al, Cr, Si, Ti, Zn or Zr. For example, the insulating layer 133 may include one selected from the group consisting of $SiO_2$, $Si_3N_4$, $Al_2O_3$ and/or $TiO_2$. The insulating layer 133 may be prepared as a single layer or as multiple layers, although embodiments are not limited thereto.

The process for forming the electrodes 135 and 137 shown in FIG. 31 can be interchanged with the process for forming the insulating layer 133 shown in FIG. 32.

Figure 33:
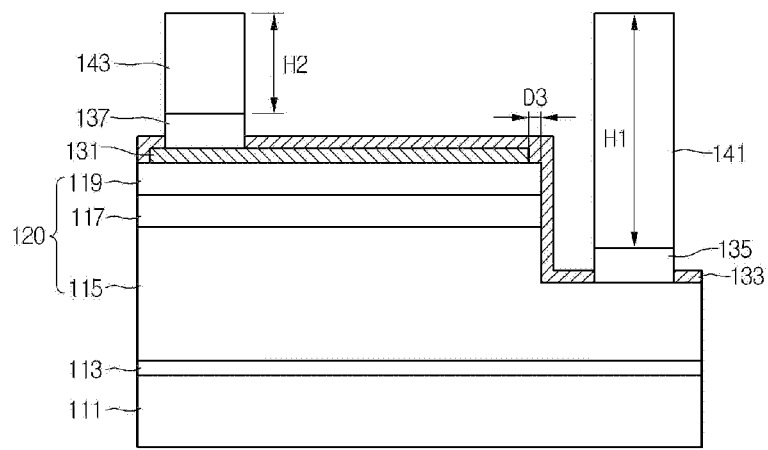

Referring to FIG. 33, the first connection electrode 141 is bonded to the first electrode 135 and the second connection electrode 143 is bonded to the second electrode 137. The first connection electrode 141 includes a conductive pad, such as a solder ball and/or a metal bump, and may be bonded onto the first electrode 135. The first connection electrode 141 can be vertically aligned to the top surface of the first conductive semiconductor layer 115. The second connection electrode 143 may include a conductive pad, such as a solder ball and/or a metal bump, and may be bonded to the second electrode 137. The second connection electrode 143 can be vertically aligned to the top surface of the second conductive semiconductor layer 119.

Figure 34:
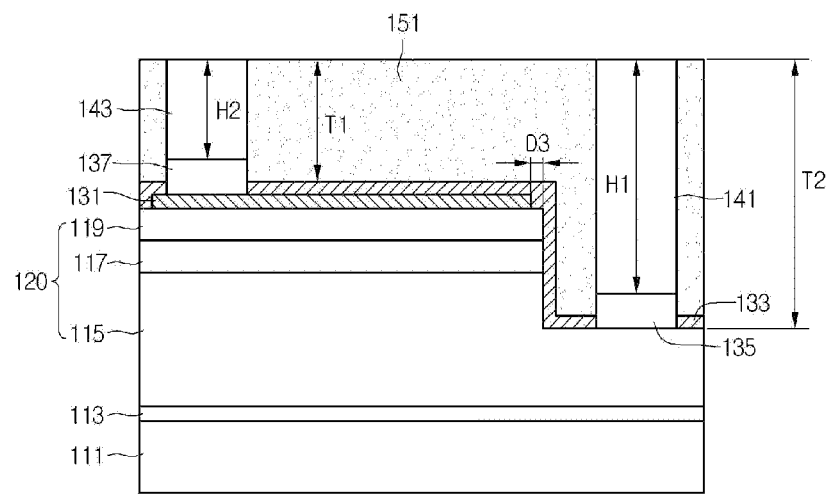

Referring to FIG. 34, the support member 151 may be formed on the insulating layer 133 through the squeeze scheme and/or the dispensing scheme.

The support member 151 may be prepared as an insulating support layer by adding the thermal diffuser to a resin, such as silicon or epoxy.

The thermal diffuser may include at least one of oxide, nitride, fluoride and/or sulfide including Al, Cr, Si, Ti, Zn and/or Zr. For example, the thermal diffuser may include a ceramic material. The thermal diffuser may be a powder particle having a predetermined size, a grain, a filler and/or an additive.

The thermal diffuser may include the ceramic material. The ceramic material may include the LTCC (low temperature co-fired ceramic) or the HTCC (high temperature co-fired ceramic). The ceramic material may include a metal nitride having a thermal conductivity higher than nitride or oxide. For example, the metal nitride may include a material having the thermal conductivity equal to or higher than 140 W/mK. For example, the ceramic material may include one selected from the group consisting of $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and/or AlN. The thermal conductive material may include a C-component, such as diamond or CNT. Additionally, the amount of the thermal diffuser added to the support member 151 may be 1~99 wt %. In order to improve the thermal diffusion efficiency, at least 50 wt % of the thermal diffuser can be added to the support member 151.

The support member 151 can be formed by mixing a polymer with ink or paste using a ball mill, a planetary ball mill, an impellor mixing, a bead mill and/or a basket mill. In this example, a solvent and a dispersing agent can be used to uniformly distribute the mixture. The solvent may be added to adjust viscosity. In the example of ink, 3 to 400 Cps of the solvent is added. Additionally, in the example of paste, 100 to one million Cps of the solvent is added. The solvent may include one selected from the group consisting of water, methanol, ethanol, isopropanol, butylcabitol, MEK, toluene, xylene, diethyleneglycol (DEG), formamide (FA), α-terpineol (TP), γ-butylrolactone (BL), Methylcellosolve (MCS), Propylmethylcellosolve (PM), and/or a combination thereof. In order to reinforce a coupling strength between particles, silane-based additives, such as 1-Trimethylsilylbut-1-yne-3-ol, Allytrimethylsilane, Trimethylsilyl methanesulfonate, Trimethylsilyl tricholoracetate, Methyl trimethylsilylacetate, or Trimethylsilyl propionic acid, may be added to the solvent. In this example, gelation may occur, so an addition of the silane-based additives may be seriously considered.

In the manufacturing process, the connection electrode, such as the solder bump, may be previously manufactured and bonded and the support member may be provided around the connection electrode. In contrast, after printing or dispensing the insulating layer including the ink or the paste, the insulating layer may be cured, and then a conductive material is filled in a hole corresponding to the connection electrode, thereby forming the connection electrode.

The support member 151 may have the height corresponding to the top surface of the first and second connection electrodes 141 and 143.

The support member 151 may be provided around the first and second connection electrodes 141 and 143 and the first and second electrodes 135 and 137. The top surfaces of the first and second connection electrodes 141 and 143 are exposed through the top surface of the support member 151.

The support member 151 may be an insulating support layer that supports the connection electrodes 141 and 143. The connection electrodes 141 and 143 are inserted into the support member 151.

The support member 151 may have the thickness T sufficient for exposing the top surfaces of the first and second connection electrodes 141 and 143. According to an embodiment, after the support member 151 has been formed, connection electrode holes may be formed in the support member 151 to form the first and second connection electrodes 141 and 143.

The support member 151 may be cured at a predetermined temperature. For example, the support member 151 may be cured at the temperature of 200° C.±100° C., which may not exert influence upon the semiconductor layer.

Figure 35:
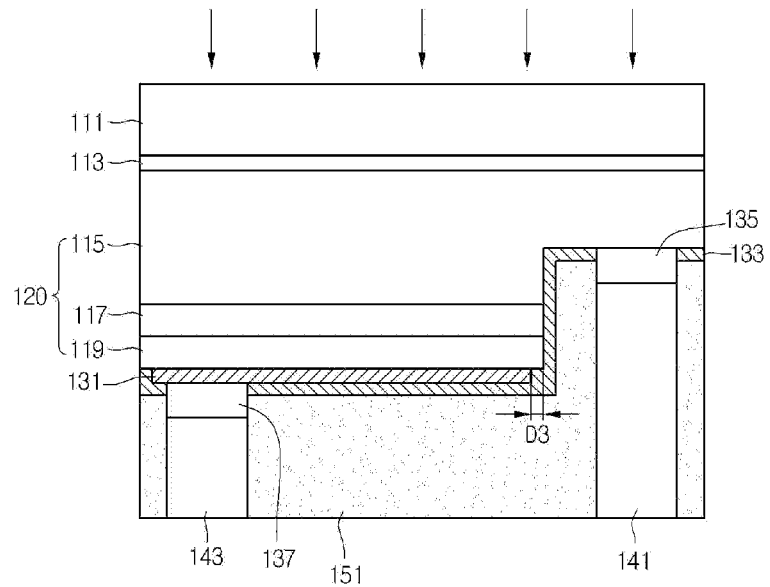

Referring to FIG. 35, if the wafer as shown in FIG. 34 is rotated by an angle of 180°, the substrate 111 is located at the uppermost position of the light emitting device as shown in FIG. 35. In this state, the substrate 111 may be subject to the lift off process. The lift off process may be adopted to remove the substrate in the physical scheme and/or the chemical scheme. According to the physical scheme, a laser may be irradiated onto the substrate 111 to remove the substrate 111. Additionally, according to the chemical scheme, a hole is formed in the substrate 111 and the semiconductor layer between the substrate 111 and the first conductive semiconductor layer 115 is removed through the wet etching, thereby separating the substrate 111 from the light emitting structure 120.

Figure 36:
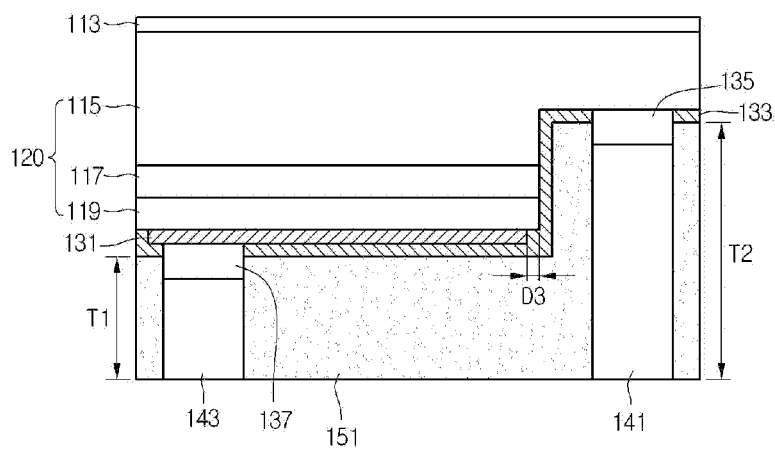

Referring to FIGS. 35 and 36, if the substrate 111 is removed, the first semiconductor layer 113 is exposed as shown in FIG. 11 so that the first semiconductor layer 113 can be removed through a wet etching process. Alternatively, the first semiconductor layer 114 may not removed.

Figure 37:
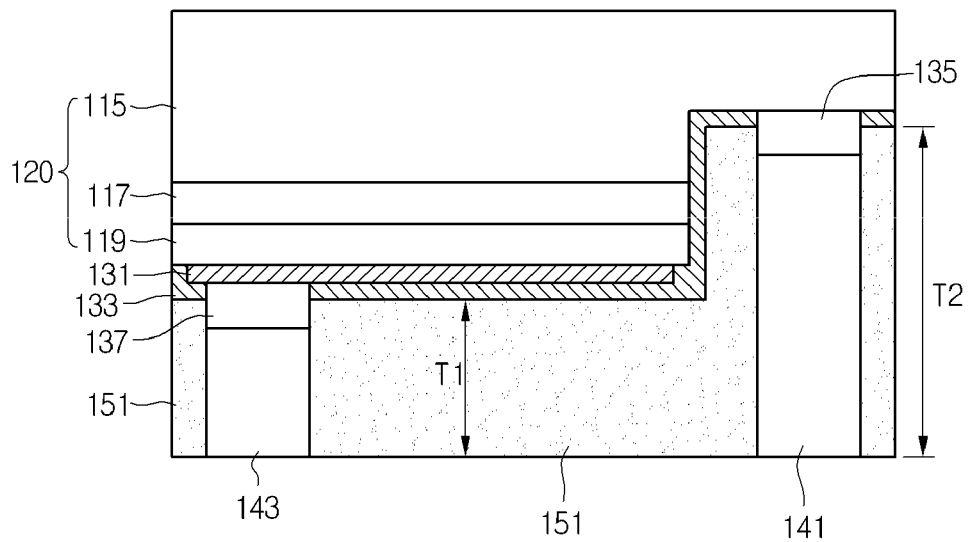

Referring to FIGS. 36 and 37, the light emitting device 101 may be packaged at the wafer level and divided into individual chips through scribing, breaking and/or cutting work, so that the light emitting device 101 as shown in FIG. 37 can be provided. Since the light emitting device is packaged in the wafer level, the light emitting device can be mounted on the module substrate through the flip bonding scheme without using a wire. Additionally, since the light exit surface is aligned toward the top surface and lateral sides of the light emitting structure 120, other than the electrode, the light loss can be reduced and brightness and light distribution can be improved.

The lower surface area of the support member 151 may be equal to the top surface area of the light emitting structure 120 and the height of the support member 151 may be greater than a thickness of the first and second electrodes 135 and 137 to the extent that the support member 151 can be aligned on the same horizontal plane with the lower surfaces of the connection electrodes 141 and 143.

Figure 38:
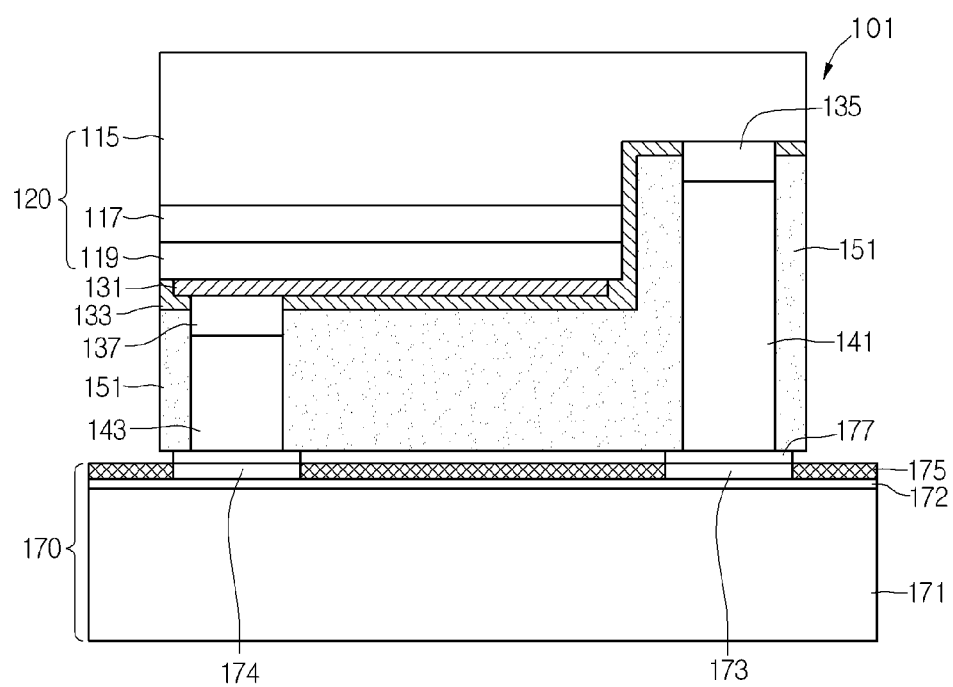
FIG. 38 is a side sectional view of a light emitting apparatus having the light emitting device shown in FIG. 26.

FIG. 38 is a side sectional view showing a light emitting apparatus having the light emitting device shown in FIG. 1.

Referring to FIG. 38, the light emitting device 101 may be mounted on a module substrate 170 through a flip scheme.

The module substrate 170 may include a metal layer 171, an insulating layer 172 and a protective layer 175. The insulating layer 172 may be formed on the metal layer 171 of the module substrate 170, and the first and second pads 173 and 174 may be formed on the insulating layer 172. The first and second pads 173 and 174 may be land patterns for supplying power. The protective layer 175 may be formed on the insulating layer 172 except for a region for the first and second pads 173 and 174. The protective layer 175 may be a solder resist layer and may include a white protective layer or a green protective layer. The protective layer 175 may effectively reflect the light, so that quantity of reflected light can increase.

The module substrate 170 may include a printed circuit board (PCB) having a circuit pattern (not shown). The module substrate 170 may also include a resin PCB, a metal core PCB (MCPCB), and/or a flexible PCB (FPCB), although embodiments are not limited thereto.

The first connection electrode 141 (of the light emitting device 101) may be aligned to correspond to the top surface of the first pad 173, and the second connection electrode 143 (of the light emitting device 101) may be aligned to correspond to the top surface of the second pad 174. The first pad 173 is bonded with the first connection electrode 141 by a bonding material 177, and the second pad 174 is bonded with the second connection electrode 143 by the bonding material 177.

A distance between the lower surfaces of the first and second connection electrodes 141 and 143 (of the light emitting device 101) and the top surface of the module substrate 170 may be equal to a distance between the lower surface of the support member 151 and the top surface of the module substrate 170.

Although it has been described that one light emitting device 101 is mounted on the module substrate 170, a plurality of light emitting devices may be arrayed on the module substrate 170, and embodiments are not limited thereto.

Figure 39:
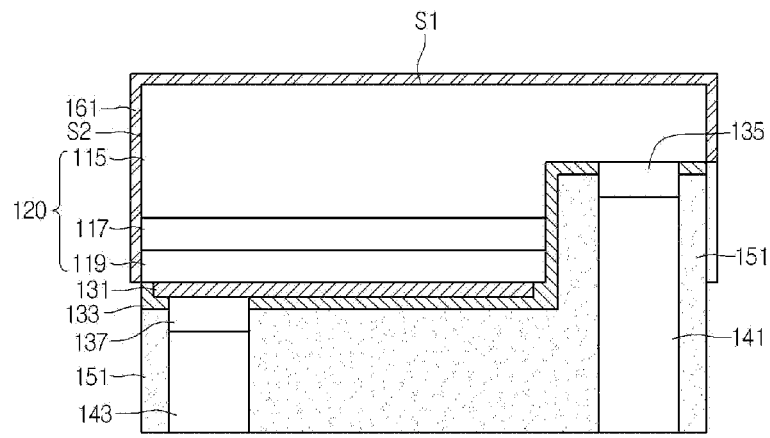
FIG. 39 is a side sectional view of a light emitting device according an the eleventh embodiment.

FIG. 39 is a side sectional view showing a light emitting device according to an eleventh embodiment. Other embodiments and configurations may also be provided.

Referring to FIG. 39, the light emitting device may include a phosphor layer 161 formed on a top surface of the light emitting structure 120 in opposition to the support member 151. The phosphor layer 161 may include a phosphor film or a coated layer, and may be prepared as a single layer or as multiple layers.

The phosphor layer 161 may include a transmittive resin layer containing luminescence or phosphor materials. The transmittive resin layer may include silicon or epoxy, and the luminescence or phosphor material may include one selected from the group consisting of YAG, TAG, silicate, nitride, and/or oxy-nitride-based material. The phosphor material may include at least one of a red phosphor material, a yellow phosphor material and/or a green phosphor material, and may excite a part of the light emitted from the active layer 117 such that the light has various wavelengths.

The phosphor layer 161 may be formed on a top surface S1 of the substrate 111 and lateral sides S2 of the substrate 111 and the light emitting structure 120. The phosphor layer 161 has the thickness in the range of 1~100,000 μm or 1~10,000 μm.

The phosphor layer 161 may include various phosphor layers different from each other, in which a first layer is one of red, yellow and/or green phosphor layers, and a second layer is formed on the first layer and is different from the first layer. Two different phosphor layers can be disposed on first and second regions, which are not overlapped with each other, respectively. A protective layer including a transmittive resin material can be formed on the lateral sides of the phosphor layer 161 and the light emitting structure, although embodiments are not limited thereto.

Figure 40:
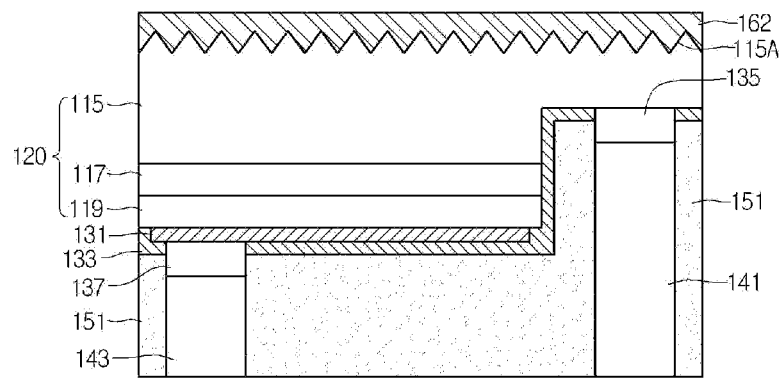
FIG. 40 is a side sectional view of a light emitting device according to a twelfth embodiment.

FIG. 40 is a side sectional view showing a light emitting device according to a twelfth embodiment. Other embodiments and configurations may also be provided.

Referring to FIG. 40, a plurality of protrusions 115A may be formed at an upper portion of the first conductive semiconductor layer 115. The protrusions 115A protrude in opposition to the support member 151 to change a critical angle of the light incident through the first conductive semiconductor layer 115. Thus, the light extraction efficiency of the light emitting device can be improved. The protrusions 115A may have lens shapes or polygonal shapes and may be arranged in the form of a stripe pattern or a matrix. Each protrusion 115A may have a three-dimensional structure, such as a polygonal horn structure.

A phosphor layer 162 may be disposed on the top surface of the first conductive semiconductor layer 115. A lower surface of the phosphor layer 162 has a concavo-convex shape extending along the protrusions 115A, and a top surface of the phosphor layer 162 has a flat shape or a concavo-convex shape.

The phosphor layer 162 can be formed on the top surface or a part of the top surface of the first conductive semiconductor layer 115. Additionally, the phosphor layer 162 can be formed on the lateral sides of the light emitting structure 120, although embodiments are not limited thereto.

Figure 41:
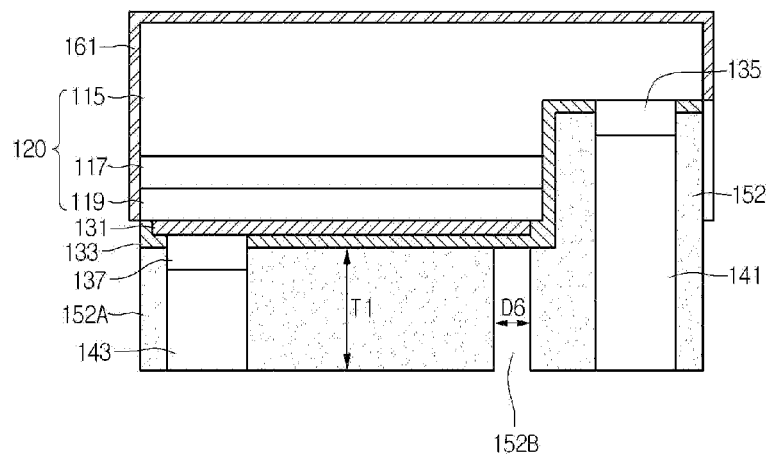
FIGS. 41 and 42 are a side sectional view and a bottom view of a light emitting device according to a thirteenth embodiment, respectively.
Figure 42:
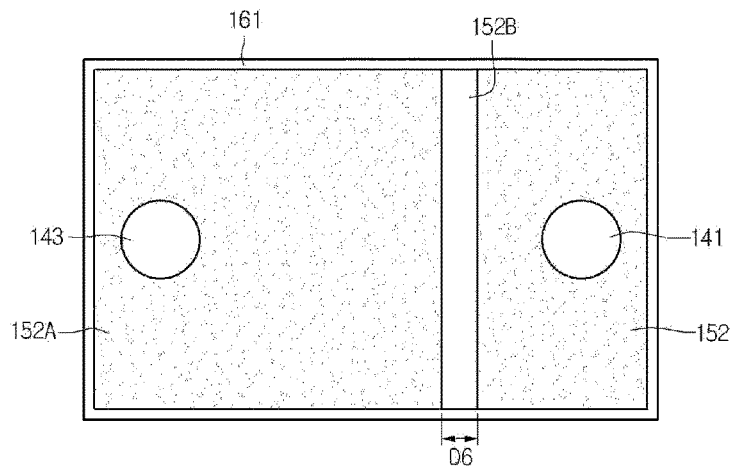

FIG. 41 is a view showing a light emitting device according to a thirteenth embodiment. FIG. 42 is a bottom view of FIG. 41. Other embodiments and configurations may also be provided.

Referring to FIGS. 41 and 42, a division slot 152B may be formed between support members 152 and 152A. The division slot 152B may divide the support members 152 and 152A from each other. The first support member 152 is disposed under one side of the light emitting structure 120 around the first connection electrode 141. The second support member 152A is disposed under the other side of the light emitting structure 120 around the second connection electrode 143.

The division slot 152B may physically and electrically separate the first support member 152 from the second support member 152A, and may expose the insulating layer 133 formed under the division slot 152B.

The first and second support members 152 and 152A may include the insulating material or the conductive material. The insulating material may include a resin material having the thermal diffuser. The conductive material may include carbon, SiC and/or a metal. If the first and second support members 152 and 152A include the conductive material, the first and second electrodes 141 and 142 may include materials different from the conductive material. Since the first and second support members 152 and 152A including the conductive material are separated from each other by the division slot 152B, the electric short may be prevented.

The division slot 152B has a width D6 corresponding to a distance between the first and second support members 152 and 152A, and a depth corresponding to the height T1 of the second support member 152A. The division slot 152B may prevent an electric interference between the first and second support members 152 and 152A.

The lower surfaces of the first and second support members 152 and 152A may be aligned on a same plane (i.e., a horizontal plane) with the lower surfaces of the first and second connection electrodes 141 and 143. The first and second support members 152 and 152A can be mounted through the first and second connection electrodes 141 and 143 even when the first and second support members 152 and 152A include the conductive materials.

An insulating material including a ceramic material can be further disposed between first and second support members 152 and 152A. In this example, the ceramic material may be aligned on a same plane (i.e., a horizontal plane) with the lower surfaces of the first and second support members 152 and 152A.

Figure 43:
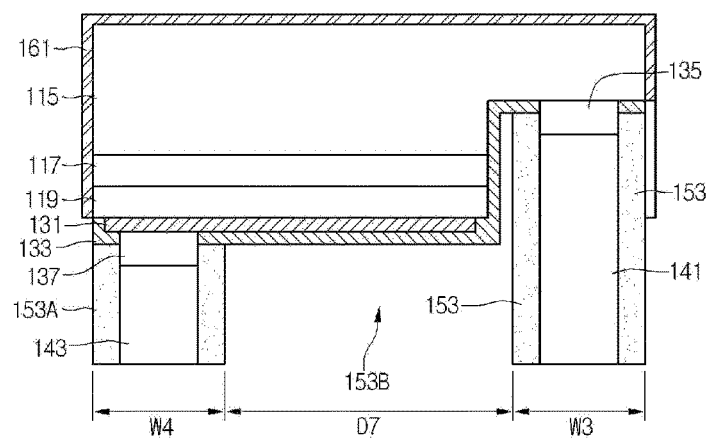
FIGS. 43 and 44 are a side sectional view and a bottom view of a light emitting device according to a fourteenth embodiment, respectively.
Figure 44:
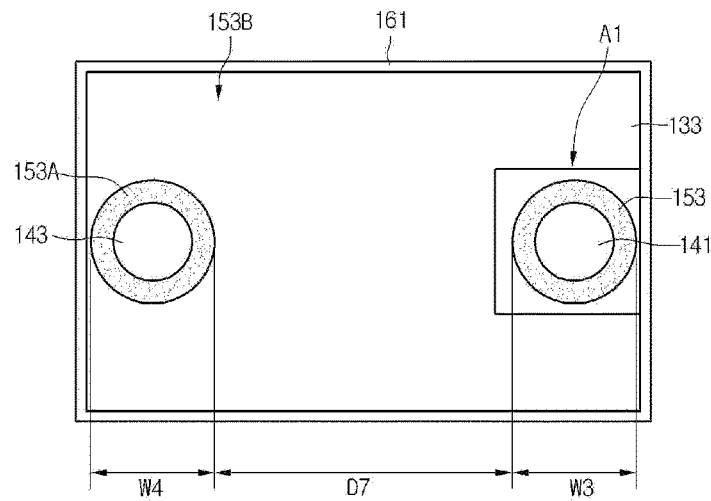

FIG. 43 is a view showing a light emitting device according to a fourteenth embodiment. FIG. 44 is a bottom view of FIG. 43. Other embodiments and configurations may also be provided.

Referring to FIGS. 43 and 44, the light emitting device may include a plurality of support members 153 and 153A provided around the first and second connection electrodes 141 and 143. A peripheral portion of the first connection electrode 141 may be covered with the first support member 153 and a peripheral portion of the second connection electrode 143 may be covered with the second support member 153A. The first and second support members 153 and 153A may include insulating materials or conductive materials.

A width W3 of the first support member 153 may be wider than a width of the first connection electrode 141, so that the first support member 153 may serve as a thermal and electrical conductive path together with the first connection electrode 141. A width W4 of the second support member 153A may be wider than a width of the second connection electrode 143, so that the second support member 153A may serve as a thermal and electrical conductive path together with the second connection electrode 143.

A distance D7 between the first and second support members 153 and 153A may be at least ½ of a length of one lateral side of the light emitting structure 120.

An insulating material including a ceramic material can be further disposed between first and second support members 153 and 153A. In this example, the ceramic material is aligned on the same plane (horizontal plane) with the lower surfaces of the first and second support members 153 and 153A.

Figure 45:
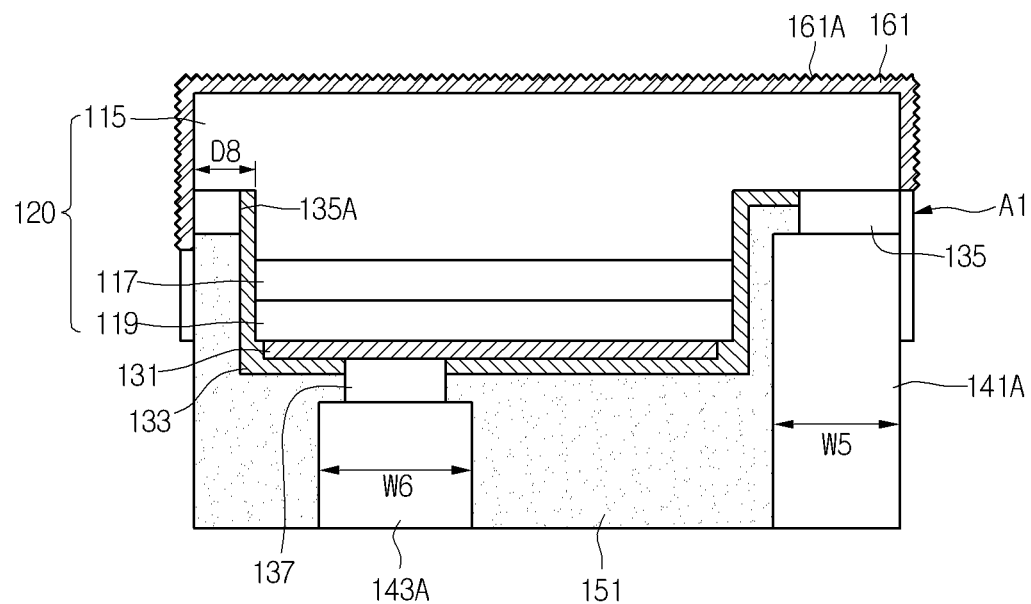
FIG. 45 is a side sectional view of a light emitting device according to a fifteenth embodiment.

FIG. 45 is a side sectional view showing a light emitting device according to a fifteenth embodiment. Other embodiments and configurations may also be provided.

Referring to FIG. 45, a width W5 of a first connection electrode 141A may be wider than a width of the first electrode 135 and lateral sides of the first connection electrode 141A and the first electrode 135 may be aligned on a same plane (i.e., a vertical plane) with the lateral sides of the light emitting structure 120. The predetermined region A1 of the light emitting structure 120 may be etched such that the etch region of the first conductive semiconductor layer 115 can be exposed. An edge region of the light emitting structure 120 may be spaced apart from the lateral side of the light emitting structure 120 by a predetermined distance D8 along the edge region of the first conductive semiconductor layer 115 and can be formed in a loop shape. A part 135A of the first electrode 135 may be formed in a loop shape along the edge region of the first conductive semiconductor layer 115. The loop shape may include an open loop shape or a closed loop shape.

A width W6 of a second connection electrode 143A may be wider than a width of the second electrode 137.

The light extracting structure, such as roughness, may be formed on a surface 161A of the phosphor layer 161.

Figure 46:
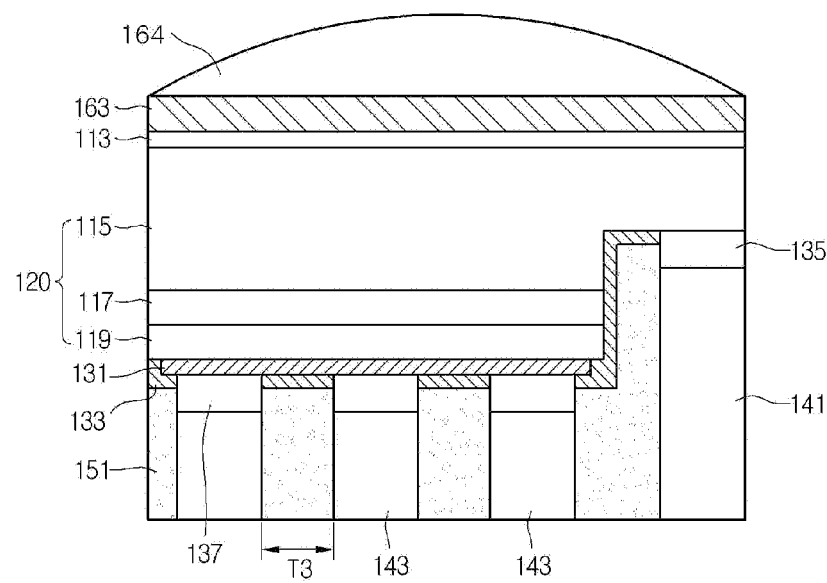
FIG. 46 is a side sectional view of a light emitting device according to a sixteenth embodiment.

FIG. 46 is a side sectional view showing a light emitting device according to a sixteenth embodiment. Other embodiments and configurations may also be provided.

Referring to FIG. 46, the light emitting device may include the first semiconductor layer 113, the phosphor layer 163 and the lens 164. The phosphor layer 163 may be formed on the top surface of the first semiconductor layer 113, and the lens 164 may be formed on the phosphor layer 163. The top surface of the first semiconductor layer 113 may be formed with the concavo-convex pattern, embodiments are not limited thereto.

The phosphor layer 163 may have a predetermined thickness and the lens 164 formed on the phosphor layer 163 may have a convex lens shape. The lens 164 may also have a concave lens shape or an aspheric lens shape having a concavo-convex pattern, and embodiments are not limited thereto.

A plurality of second electrodes 137 are formed under the reflective electrode layer 131, and second connection electrodes 143 are aligned under the second electrodes 137. The second connection electrodes 143 are spaced apart from each other at a predetermined interval T3. When viewed from the bottom of the light emitting device, the second connection electrodes 143 are aligned in the form of a dot matrix. The support members 151 are disposed between first and second connection electrodes 141 and 143 and between the second connection electrodes 143 to serve as an insulating support layer. Since the second connection electrodes 143 are disposed under the light emitting structure, the strength of the support member 151 can be reinforced and electric contact efficiency can be improved. Additionally, the bonding defect can be prevented from occurring at the second connection electrode 143 of the light emitting device. A plurality of first connection electrodes 141 can be provided, and embodiments are not limited thereto.

Figure 47:
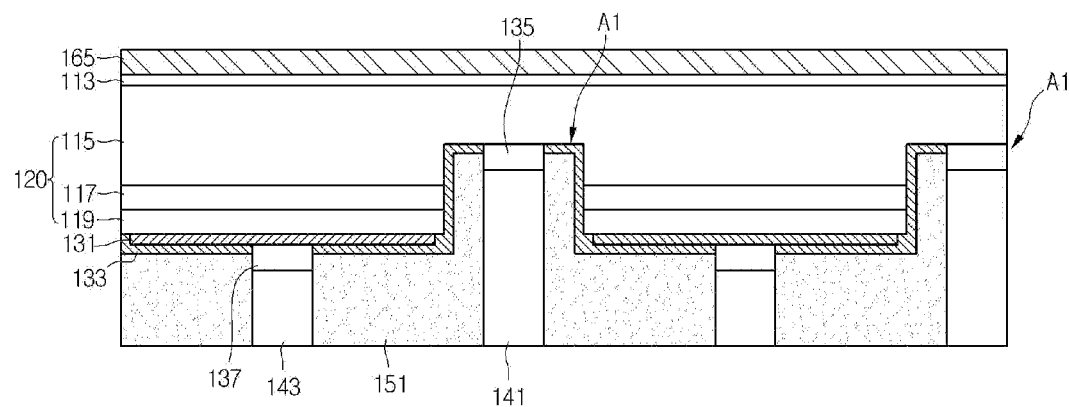
FIG. 47 is a side sectional view of a light emitting device according to a seventeenth embodiment.

FIG. 47 is a side sectional view showing a light emitting device according to a seventeenth embodiment. Other embodiments and configurations may also be provided.

Referring to FIG. 47, predetermined regions A1 of the light emitting structure 120 are etching regions to expose the first conductive semiconductor layer 115 at various regions. The first electrodes 135 are disposed under the first conductive semiconductor layer 115 and the second electrodes 137 are disposed under the reflective electrode layer 131. Since the first and second electrodes 135 and 137 are alternately aligned, current may be uniformly supplied. The light emitting structure 120 is defined by a plurality of cells, so that brightness can be improved.

Figure 48:
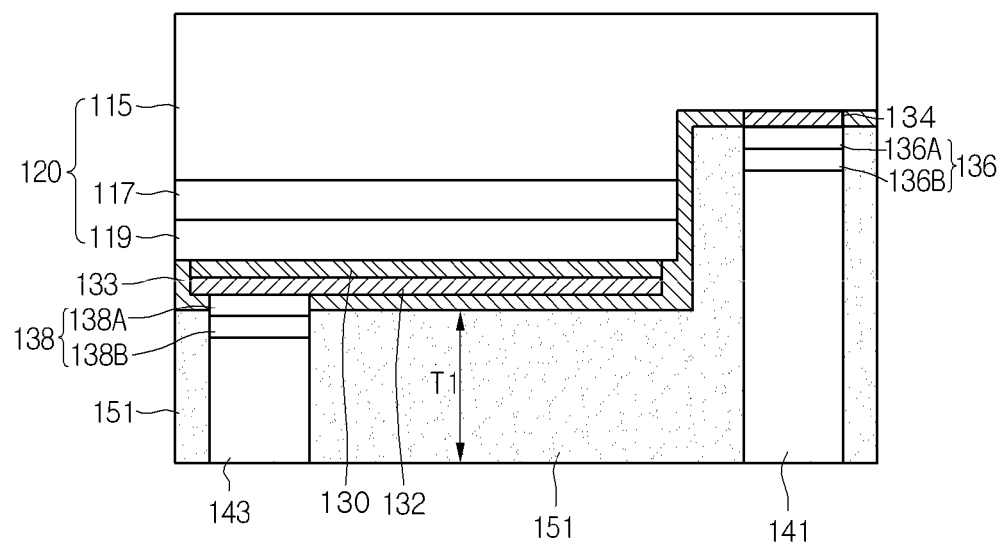
FIG. 48 is a side sectional view of a light emitting device according to an eighteenth embodiment.

FIG. 48 is a side sectional view showing a light emitting device according to a eighteenth embodiment. Other embodiments and configurations may also be provided. In the following description, the same reference numerals will be assigned to elements and structures that have been described in the first embodiment and detailed description thereof may be omitted in order to avoid redundancy.

Referring to FIG. 48, the reflective electrode layer 130 and the second electrode pad 132 are disposed under the light emitting structure 120, and the reflective electrode layer 130 may serve as an ohmic and reflective electrode under the second conductive semiconductor layer 119. The second electrode pad 132 may have a layered shape or a pattern shape.

A first electrode pad 134 is disposed under the first conductive semiconductor layer 115. The first electrode pad 134 may contact the first conductive semiconductor layer 115 and may be bonded between a first electrode bonding layer 136 and the first conductive semiconductor layer 115. The first electrode bonding layer 136 may be bonded between the first electrode pad 134 and the first connection electrode 141 to electrically connect the first electrode pad 134 with the first connection electrode 141. The first electrode bonding layer 136 may include a first bonding electrode 136A and a second bonding electrode 136B under the first bonding electrode 136A. The first bonding electrode 136A may be bonded to the first electrode pad 134, and the second bonding electrode 136B may be bonded between the first connection electrode 141 and the first bonding electrode 136A.

The first electrode pad 134 has the structure with a material and a thickness the same as those of the stack structure of the second electrode pad 132. For example, the first and second electrode pads 134 and 132 may include an adhesive layer, a reflective layer under the adhesive layer, a diffusion barrier layer under the reflective layer, and a bonding layer under the diffusion barrier layer. The first electrode bonding layer 136 may be bonded between the first connection electrode 141 and the first electrode pad 134 to improve a bonding property between the first connection electrode 141 and the first electrode pad 134.

The first bonding electrode 136A of the first electrode bonding layer 136 may be bonded with the second bonding electrode 136B that is bonded to the first connection electrode 141, so that the physical bonding and electrical connection property of the first connection electrode 141 can be improved.

The reflective electrode layer 130 is formed under the second conductive semiconductor layer 119 and the second electrode pad 132 is formed under the reflective electrode layer 130. A lower surface area of the reflective electrode layer 130 may be equal to or smaller than a top surface area of the second electrode pad 132, although embodiments are not limited thereto. A second electrode bonding layer 138 is formed between the second electrode pad 132 and the second connection electrode 143 to improve bonding strength between the second electrode pad 132 and the second connection electrode 143.

The second electrode bonding layer 138 may connect the second electrode pad 132 with the second connection electrode 143. The second electrode bonding layer 138 may include a third bonding electrode 138A and a fourth bonding electrode 138B under the third bonding electrode 138A. The third bonding electrode 138A is bonded to the second electrode pad 132 and the fourth bonding electrode 138B is bonded between the second connection electrode 143 and the third bonding electrode 138A.

The second electrode bonding layer 138 is bonded between the second connection electrode 143 and the second electrode pad 132 to improve a bonding property between the second connection electrode 143 and the second electrode pad 132. The first electrode pad 134 serves as a first electrode and the second electrode pad 132 serves as a second electrode.

Figure 49:
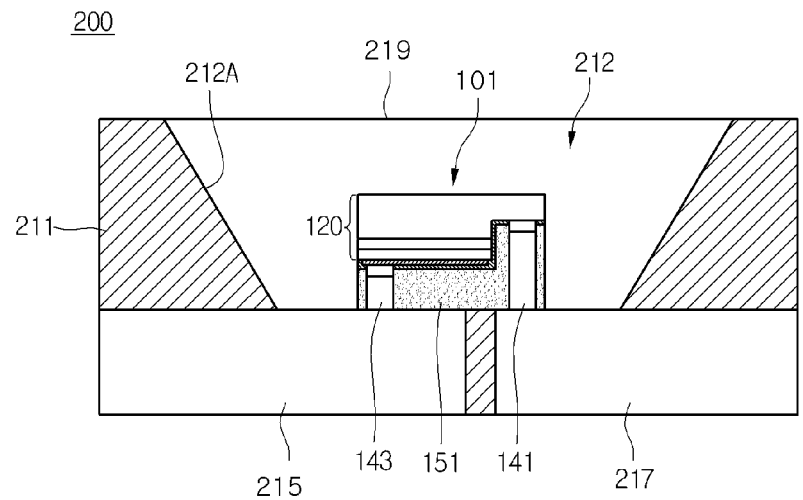
FIG. 49 is a sectional view showing a light emitting device package having the light emitting device of FIG. 26.

FIG. 49 is a sectional view showing a light emitting device package having the light emitting device of FIG. 26.

Referring to FIG. 49, a light emitting device package 201 may include a body 211, first and second lead electrodes 215 and 217 installed in the body 211, a molding member 219 and the light emitting device 101.

The body 211 is injection molded by using one of a high reflective resin (for example, PPA), a polymeric material and/or a plastic material, and may be prepared as a substrate having a single layer or as multiple layers. The body 211 may include a cavity 212 having an open top surface, in which a sidewall of the cavity 212 is inclined or is vertical to a lower surface of the cavity 212.

The first and second lead electrodes 215 and 217 are disposed in the cavity 212 such that the first and second lead electrodes 215 and 217 are spaced apart from each other.

The light emitting device 101 according to previous embodiment(s) may be bonded to the first and second lead electrodes 215 and 217 through the flip scheme. The first connection electrode 141 (of the light emitting device 101) is bonded to the first lead electrode 215 and the second connection electrode 143 (of the light emitting device 101) is bonded to the second lead electrode 217.

The distance between the top surface of the first lead electrode 215 and the lower surface of the light emitting device 101, (i.e., the lower surfaces of the first connection electrode 141, the second connection electrode 143 and the support member 151) may be equal to the distance between the top surface of the second lead electrode 217 and the lower surface of the light emitting device 101, although embodiments are not limited thereto.

The support member 151 (of the light emitting device 101) is formed on the first lead electrode 215 and the second lead electrode 217 to dissipate heat through an entire surface of the support member 151.

The molding member 219 is formed in the cavity 212. The molding member 219 may include a transmittive resin material, such as silicon or epoxy. The molding member 219 may further include a phosphor material.

Most of the light generated from the light emitting device 101 may be extracted through the top surface and the lateral sides of the light emitting device 101 and the extracted light is dissipated to outside through the molding member 217.

One or a plurality of light emitting devices 101 can be mounted in the light emitting device package 201, although embodiments are not limited thereto. If the light emitting device having the phosphor layer as shown in FIG. 39 is mounted in the light emitting device package, the phosphor material may not be added to the molding member 127A. Additionally, various phosphor materials different from each other or phosphor materials emitting similar colors can be added to the molding member 127A.

<Lighting System

The light emitting device or the light emitting device package according to an embodiment may be applied to a light unit. The light unit may have a structure in which a plurality of light emitting devices or a plurality of light emitting device packages are arrayed. The light unit may include a display device (shown in FIGS. 50 and 51) and/or a lighting device (shown in FIG. 52). Additionally, the light unit may include an illumination lamp, a signal lamp, a headlight of a vehicle, and/or an electric sign board.

Figure 50:
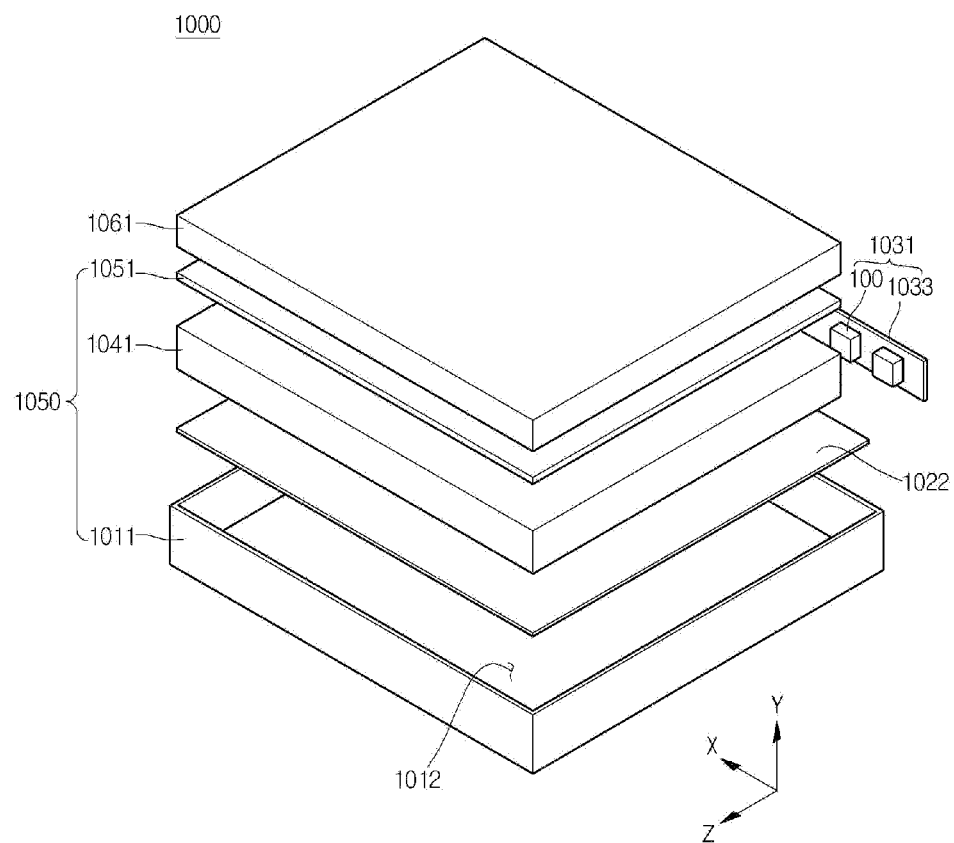
FIG. 50 is an exploded perspective view showing a display device according to an embodiment.

FIG. 50 is an exploded perspective view showing a display device 1000 according to an embodiment. Other embodiments and configurations may also be provided.

Referring to FIG. 50, the display device 1000 includes a light guide plate 1041, a light emitting module 1031 for supply the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, embodiments are not limited to this structure.

The bottom cover 1011, the reflective sheet 1022, the light guide plate 1041 and the optical sheet 1051 may constitute a light unit 1050.

The light guide plate 1041 may diffuse the light to provide a surface light. The light guide plate 1041 may include a transparent material. For example, the light guide plate 1041 may include one of acryl-based resin, such as polymethyl methacrylate (PMMA), polyethylene terephthalate (PET), polycarbonate (PC), cyclic olefin copolymer (COC) and/or polyethylene naphthalate (PEN) resin.

The light emitting module 1031 may supply the light to at least one side of the light guide plate 1041 and may serve as the light source of the display device.

At least one light emitting module 1031 may be provided to directly or indirectly supply the light from the lateral side of the light guide plate 1041. The light emitting module 1031 may include a module substrate 1033 and light emitting devices 100 according to embodiments. The light emitting devices 100 (or 101) may arranged on the module substrate 1033 while being spaced apart from each other at the predetermined interval. According to another embodiment, the light emitting device packages may be arrayed on the module substrate 1033.

The module substrate 1033 may include a printed circuit board (PCB) having a circuit pattern (not shown). Additionally, the module substrate 1033 may also include a metal core PCB (MCPCB) or a flexible PCB (FPCB) as well as a typical PCB, although embodiments are not limited thereto. If the light emitting devices 100 (101) are installed on the lateral side of the bottom cover 1011 or on a heat dissipation plate, the module substrate 1033 may be omitted. The heat dissipation plate may partially contact with the top surface of the bottom cover 1011.

Additionally, the light emitting devices 100 (or 101) may be arranged such that light exit surfaces for emitting light onto the module substrate 1033 are spaced apart from the light guide plate 1041 by a predetermined distance, although embodiments are not limited thereto. The light emitting devices 100 (or 101) may directly or indirectly supply the light to a light incident surface, which is one side of the light guide plate 1041, although embodiments are not limited thereto.

The reflective member 1022 is disposed under the light guide plate 1041. The reflective member 1022 may reflect the light, which travels downward through the lower surface of the light guide plate 1041, toward the light guide plate 1041, thereby improving brightness of the light unit 1050. For example, the reflective member 1022 may include PET, PC or PVC resin, although embodiments are not limited thereto. The reflective member 1022 may serve as the top surface of the bottom cover 1011, although embodiments are not limited thereto.

The bottom cover 1011 may receive the light guide plate 1041, the light emitting module 1031, and the reflective member 1022 therein. The bottom cover 1011 may have a receiving section 1012 having a box shape with an open top surface, although embodiments are not limited thereto. The bottom cover 1011 can be coupled with the top cover, although embodiments are not limited thereto.

The bottom cover 1011 can be manufactured through a press process or an extrusion process by using a metallic material or a resin material. Additionally, the bottom cover 1011 may include a metal or a non-metallic material having a superior thermal conductivity, although embodiments are not limited thereto.

The display panel 1061, for example, may be an LCD panel including transparent first and second substrates, which are opposite to each other, and a liquid crystal layer interposed between the first and second substrates. A polarizing plate can be attached to at least one surface of the display panel 1061, but embodiments are not limited thereto. The display panel 1061 may display information based on the light that has passed through the optical sheet 1051. The display device 1000 can be applied to various portable terminals, monitors or laptop computers, and/or televisions.

The optical sheet 1051 is disposed between the display panel 1061 and the light guide plate 1041 and may include at least one transmissive sheet. For example, the optical sheet 1051 may include at least one of a diffusion sheet, a horizontal and vertical prism sheet, and a brightness enhancement sheet. The diffusion sheet may diffuse the incident light, the horizontal and vertical prism sheet concentrates the incident light onto the display region, and the brightness enhancement sheet may improve the brightness by reusing lost light. Additionally, a protective sheet can be provided on the display panel 1061, but embodiments are not limited thereto.

The light guide plate 1041 and the optical sheet 1051 can be provided on the optical path of the light emitting module 1031 as optical members, but embodiments are not limited thereto.

Figure 51:
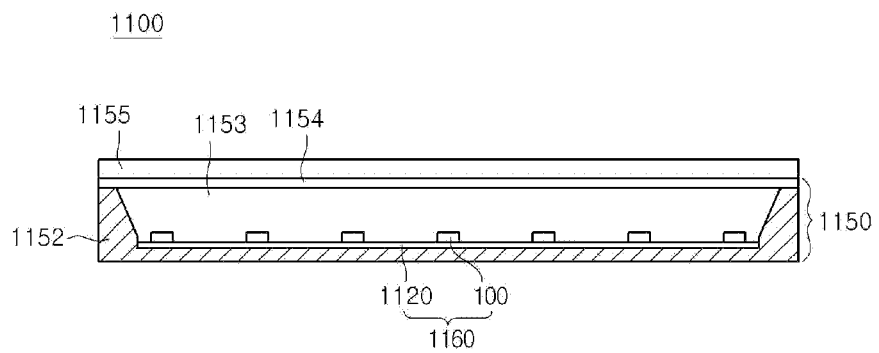
FIG. 51 is a sectional view showing a display device according to an embodiment.

FIG. 51 is a sectional view showing a display device according to an embodiment. Other embodiments and configurations may also be provided.

Referring to FIG. 51, the display device 1100 may include a bottom cover 1152, a module substrate 1120 on which the light emitting devices 100 (or 101) are arranged, an optical member 1154, and a display panel 1155.

The module substrate 1120 and the light emitting device packages 100 may constitute the light emitting module 1060. Additionally, the bottom cover 1152, at least one light emitting module 1060, and the optical member 1154 may constitute the light unit. The light emitting devices may be arrayed on the module substrate 1120 through the flip scheme. Additionally, the light emitting device packages may be arrayed on the module substrate 1120. The bottom cover 1151 can be provided with a receiving section 1153, but embodiments are not limited thereto.

The optical member 1154 may include at least one of a lens, a light guide plate, a diffusion sheet, a horizontal and vertical prism sheet, and/or a brightness enhancement sheet. The light guide plate may include PC or poly methyl methacrylate (PMMA). The light guide plate can be omitted. The diffusion sheet may diffuse the incident light, the horizontal and vertical prism sheet may concentrate the incident light to the display region, and the brightness enhancement sheet may improve the brightness by reusing the lost light.

Figure 52:
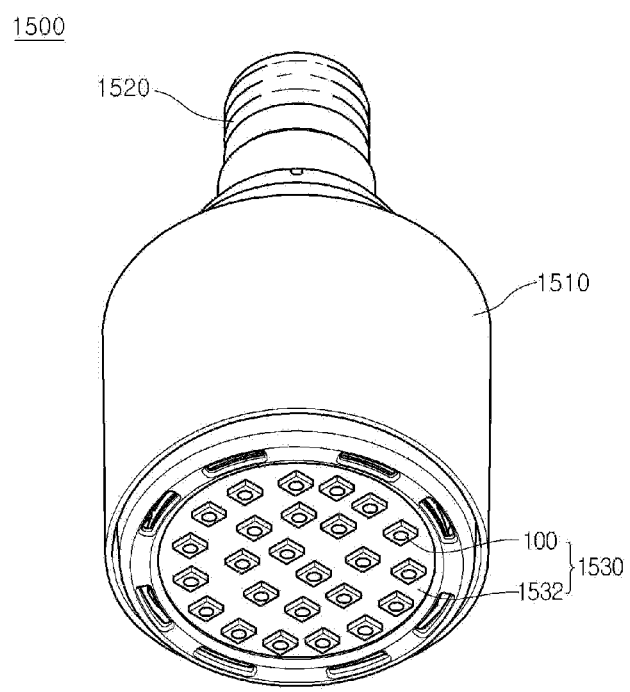
FIG. 52 is a perspective view showing a lighting device according to an embodiment.

FIG. 52 is a perspective view showing a lighting device according to an embodiment. Other embodiments and configurations may also be provided.

Referring to FIG. 52, the lighting device 1500 may include a case 1510, a light emitting module 1530 installed in the case 1510, and a connection terminal 1520 installed in the case 1510 to receive power from an external power source.

The case 1510 may include a material having a superior heat dissipation property. For example, the case 1510 may include a metallic material or a resin material.

The light emitting module 1530 may include a module substrate 1532 and light emitting devices 100 (or 101) installed on the module substrate 1532. The light emitting devices 100 may be spaced apart from each other or may arranged in the form of a matrix. The light emitting devices may be arrayed on the module substrate 1532 through the flip scheme. Additionally, the light emitting device packages may be arrayed on the module substrate 1532.

The module substrate 1532 may include an insulating member printed with a circuit pattern. For example, the module substrate 1532 may include a PCB, an MCPCB, an FPCB, a ceramic PCB, and/or an FR-4 substrate.

Additionally, the module substrate 1532 may include material that effectively reflects the light. A coating layer can be formed on the surface of the module substrate 1532. The coating layer may have a white color or a silver color to effectively reflect the light.

At least one light emitting device package 200 (or 201) may be installed on the module substrate 1532. Each light emitting device package 100 may include at least one LED (light emitting diode) chip. The LED chip may include an LED that emits light of a visible ray band having red, green, blue or white color and a UV (ultraviolet) LED that emits UV light.

The light emitting device packages 200 (or 201) of the light emitting module 1530 can be variously arranged to provide various colors and brightness. For example, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For example, the connection terminal 1520 can be prepared in the form of a pin inserted into the external power source or connected to the external power source through a wire.

An embodiment may provide a light emitting device having a novel structure.

An embodiment may provide a wafer-level packaged light emitting device.

An embodiment may provide a light emitting device that includes a support member having a ceramic-based additive formed on peripheral surfaces of first and second electrodes, and a method of manufacturing the same.

An embodiment may provide a light emitting apparatus having the light emitting device, a light emitting device package and/or a lighting device.

A light emitting device may include: a substrate; a light emitting structure including a first conductive semiconductor layer, a second conductive semiconductor layer and an active layer between the first conductive semiconductor layer and the second conductive semiconductor layer under the substrate; a first electrode under the first conductive semiconductor layer; a reflective electrode layer under the second conductive semiconductor layer; a second electrode under the reflective electrode layer; a support member disposed under the first conductive semiconductor layer and the reflective electrode layer (the support member being disposed around the first and second electrodes); a first connection electrode under the first electrode (at least a part of the first connection electrode being disposed in the support member); and a second connection electrode under the second electrode (at least a part of the second connection electrode being disposed in the support member).

A light emitting device may include a light emitting structure including a first semiconductor layer, a second conductive semiconductor layer and an active layer between the first semiconductor layer and the second conductive semiconductor layer; a first electrode under the first semiconductor layer; a reflective electrode layer under the second conductive semiconductor layer; a second electrode under the reflective electrode layer; a support member disposed under the first semiconductor layer and the reflective electrode layer (the support member being disposed around the first and second electrodes); a first connection electrode under the first electrode (at least a part of the first connection electrode being disposed in the support member); and a second connection electrode under the second electrode (at least a part of the second connection electrode being disposed in the support member).

A light emitting apparatus may include: a plurality of light emitting devices; and a module substrate for mounting the light emitting devices thereon and including first and second pads. Each light emitting device may include a light emitting structure including a first semiconductor layer, a second conductive semiconductor layer and an active layer between the first semiconductor layer and the second conductive semiconductor layer; a first electrode under the first semiconductor layer; a reflective electrode layer under the second conductive semiconductor layer; a second electrode under the reflective electrode layer; a support member disposed under the first conductive semiconductor layer and the reflective electrode layer (the support member being disposed around the first and second electrodes); a first connection electrode under the first electrode (at least a part of the first connection electrode being disposed in the support member); and a second connection electrode under the second electrode, at least a part of the second connection electrode being disposed in the support member.

A method of manufacturing a light emitting device may include: forming a light emitting structure including a first conductive semiconductor layer, an active layer and a second first conductive semiconductor layer on a substrate; etching the light emitting structure such that the first conductive semiconductor layer is partially exposed; forming a reflective electrode layer on the light emitting structure; forming an insulating layer on the reflective electrode layer and the light emitting structure; forming a first electrode on the first conductive semiconductor layer and forming a second electrode on the reflective electrode layer; forming a first connection electrode on the first electrode and forming a second connection electrode on the second electrode; forming a support layer on the insulating layer such that the support layer has a height corresponding to a top surface of the first and second connection electrodes; removing the substrate after the support member has been formed; and forming a ceramic-based thermal diffuser in the support member.

A method of manufacturing a light emitting device may include: forming a light emitting structure including a first conductive semiconductor layer, an active layer and a second first conductive semiconductor layer on a substrate; etching the light emitting structure such that the first conductive semiconductor layer is partially exposed; forming a reflective electrode layer on the light emitting structure; forming an insulating layer on the reflective electrode layer and the light emitting structure; forming a first electrode on the first conductive semiconductor layer and forming a second electrode on the reflective electrode layer; forming a first connection electrode on the first electrode and forming a second connection electrode on the second electrode; and forming a support layer on the insulating layer such that the support layer has a height corresponding to a top surface of the first and second connection electrodes, wherein a ceramic-based thermal diffuser is formed in the support member.

According to an embodiment, a flip mounting process for the light emitting device can be improved.

According to an embodiment, a light emitting device is packaged at the wafer level, so that the packaging process can be omitted, thereby reducing manufacturing steps.

According to an embodiment, a light extraction efficiency of the light emitting device can be improved.

According to an embodiment, a light dissipation efficiency of the light emitting device can be improved.

According to an embodiment, a reliability of the light emitting apparatus having the light emitting device (mounted through the flip scheme), the display device and the lighting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate having a first surface and a second surface faced to the first surface;
   a light emitting structure including a first semiconductor layer, a second conductive semiconductor layer and an active layer between the first semiconductor layer and the second conductive semiconductor layer on the first surface of the substrate;
   a first electrode on a part of the first semiconductor layer;
   an electrode layer on the second conductive semiconductor layer;
   a second electrode on the electrode layer;
   an insulating layer on the electrode layer;
   a support member disposed on the insulating layer;
   a first connection electrode connected to the first electrode;
   a second connection electrode connected to the second electrode; and
   a phosphor layer on the second surface of the substrate,
   wherein the support member is disposed around the first connection electrode and the second connection electrode, wherein the first electrode and the first connection electrode are overlapped with the part of the first semiconductor layer, wherein the insulating layer is disposed on a side surface of the light emitting structure positioned between the second electrode and the first electrode and disposed on the part of the first semiconductor layer, wherein the insulating layer includes a first layer and a second layer having a different material from the first layer, wherein the first layer of the insulating layer has a refractive index different from the second layer of the insulating layer, wherein the electrode layer has an ohmic contact layer and a reflective layer on the ohmic contact layer, wherein the second electrode is directly contacted with the electrode layer and has a plurality of second electrode part, wherein the insulating layer has a DBR (distributed Bragg reflection) structure, wherein the insulating layer is disposed between the electrode layer and the substrate, wherein the DBR structure of the insulating layer reflects light generated from the light emitting structure toward the second surface of the substrate, wherein the support member includes a first region overlapped vertically with the first semiconductor layer and a second region overlapped vertically with the second conductive semiconductor layer, wherein a thickness of the first region is greater than a thickness of the second region, wherein the support member includes a ceramic-based thermal diffuser, wherein a width of the phosphor layer is greater than a width of the second surface of the substrate, wherein an outer lateral surface of the insulating layer having the DBR structure is exposed between an outer lateral surface of the support member and a lateral surface of the light emitting structure, and wherein light generated from the light emitting structure and light reflected by the DBR structure is emitted to an outside of the phosphor layer through the second surface of the substrate.

2. The light emitting device of claim 1, wherein the support member includes an insulating resin material in contact with the first electrode, the second electrode, the first connection electrode, and the second connection electrode.

3. The light emitting device of claim 1, wherein a lateral surface of the first electrode contacts the support member and the insulating layer.

4. The light emitting device of claim 2,
wherein the thermal diffuser includes at least one of oxide, nitride, fluoride and sulfide having at least one of Al, Cr, Si, Ti, Zn, and Zr, and
wherein an amount of the thermal diffuser contained in the support member is in a range of 50~99 wt %.

5. The light emitting device of claim 1, wherein the phosphor layer is disposed on the lateral surface of the substrate and the lateral surface of the light emitting structure, and
wherein a width of the support member is smaller than the width of the phosphor.

6. The light emitting device of claim 1, wherein the outer lateral surface of the support member is disposed on a same vertical plane with the lateral surface of the substrate.

7. The light emitting device of claim 1, wherein the support member has a thickness thicker than a thickness of each of the first and second connection electrodes, and
wherein the support member is not overlapped with an outer region of the phosphor layer in a vertical direction.

8. The light emitting device of claim 7, wherein the first connection electrode has the thickness thicker than the thickness of the second connection electrode, and
wherein a sum of thicknesses of the second connection electrode and the second electrode is smaller than the thickness of the first region.

9. The light emitting device of claim 8, wherein a bottom surface of the support member is disposed on a same horizontal plane with a bottom surfaces of the first and second connection electrodes.

10. The light emitting device of claim 1, wherein a distance between the first connection electrode and the second connection electrode is a ½ or more with respect to a length of a lateral surface of the light emitting structure.

11. The light emitting device of claim 1, wherein a top surface of the first connection electrode has a wider width than a width of a bottom surface of the first electrode.

12. The light emitting device of claim 1, wherein the outer lateral surface of the support member is disposed on a same vertical plane with the lateral surface of the light emitting structure.

13. A light emitting device comprising:
a light emitting structure including a first semiconductor layer, a second conductive semiconductor layer and an active layer between the first semiconductor layer and the second conductive semiconductor layer;
a phosphor on a top surface of the light emitting structure;
a first electrode on a part of the first semiconductor layer;
an electrode layer on the second conductive semiconductor layer;
a second electrode on the electrode layer;
an insulating layer on the electrode layer;
a support member disposed on the insulating layer;
a first connection electrode connected to the first electrode; and
a second connection electrode connected to the second electrode,
wherein at least a part of the first connection electrode and the second connection electrode disposed in the support member,
wherein the first electrode and the first connection electrode are overlapped with the part of the first semiconductor layer,
wherein the insulating layer is disposed on the electrode layer and the part of the first semiconductor layer,
wherein the insulating layer includes a first layer and a second layer having a refractive index different from the first layer,
wherein the electrode layer includes a layer having an oxide material,
wherein the second electrode is directly contacted with the electrode layer,
wherein the first electrode is directly contacted with the first semiconductor layer,
wherein the first layer of the insulating layer include one selected from the group consisting of $SiO_2$, $Si_3N_4$, $Al_2O_3$ and $TiO_2$,
wherein the insulating layer has a DBR (distributed Bragg reflection) structure,
wherein the insulating layer is disposed between the electrode layer and a substrate, wherein the DBR structure of the insulating layer reflects light generated from the light emitting structure toward a surface of the phosphor layer, wherein the support member includes a first region overlapped vertically with the first semiconductor layer and a second region overlapped vertically with the second conductive semiconductor layer, wherein a thickness of the first region is greater than a thickness of the second region, wherein the support member includes a ceramic-based thermal diffuser, wherein a width of the phosphor layer is greater than a width of the top surface of the light emitting structure, wherein an outer lateral surface of the insulating layer having the DBR structure is exposed between an outer lateral surface of the support member and a lateral surface of the light emitting structure, wherein light generated from the light emitting structure and light reflected by the DBR structure is emitted to an outside of the phosphor layer through the top surface of the light emitting structure.

14. The light emitting device of claim 13, wherein a bottom surface of the support member is disposed on a same horizontal plane with bottom surfaces of the first and second connection electrodes, and wherein the outer lateral surface of the insulating layer having the DBR structure is disposed on a same vertical plane with the lateral surface of the light emitting structure and the outer lateral surface of the support member.

15. The light emitting device of claim 13, wherein a distance between the first connection electrode and the second connection electrode is ½ or more with respect to a length of one lateral side of the light emitting structure.

16. The light emitting device of claim 13, wherein a top surface of the first connection electrode has a wider width than a width of a bottom surface of the first electrode.

17. The light emitting device of claim 13,
wherein a lateral surface of the first electrode contacts an upper portion of the first region of the support member and the insulating layer, and
wherein the second region contacts the second electrode.

18. A light emitting device comprising:
a support member including an ceramic material;
a light emitting structure on the support member, the light emitting structure including a first semiconductor layer, a second conductive semiconductor layer and an active layer between the first semiconductor layer and the second conductive semiconductor layer;
a substrate on the light emitting structure;
a phosphor layer on the substrate;
a first electrode on a part of the first semiconductor layer;
an electrode layer on the second conductive semiconductor layer;
a second electrode on the electrode layer;
an insulating layer on the electrode layer;
a first connection electrode connected to the first electrode; and
a second connection electrode connected to the second electrode,
wherein the first electrode and the first connection electrode are vertically overlapped with the part of the first semiconductor layer and not vertically overlapped with the second semiconductor layer,
wherein the insulating layer is disposed on the electrode layer, a side part of the light emitting structure between the first electrode and the second electrode, and the part of the first semiconductor layer,
wherein the insulating layer includes multiple layers alternately disposed a first layer and a second layer having a refractive index different from the first layer,
wherein the electrode layer includes a contact layer contacted with the second semiconductor layer and a reflective layer on the contact layer,
wherein the first electrode is directly contacted with the first semiconductor layer,
wherein the first layer of the insulating layer is directly contacted with the electrode layer and has one selected from the group consisting of Si, Al, and Ti,
wherein the insulating layer has a DBR (distributed Bragg reflection) structure,
wherein the insulating layer is disposed between the electrode layer and a substrate, and
wherein the DBR structure of the insulating layer reflects light generated from the light emitting structure toward a surface of the phosphor layer,
wherein the support member includes a first region overlapped vertically with the first semiconductor layer and a second region overlapped vertically with the second conductive semiconductor layer,
wherein a thickness of the first region is greater than a thickness of the second region,
wherein the support member includes a ceramic-based thermal diffuser,
wherein a width of the phosphor layer is greater than a width of the second surface of the substrate,
wherein an outer lateral surface of the insulating layer having the DBR structure is exposed between an outer lateral surface of the support member and a lateral surface of the light emitting structure,
wherein the outer lateral surface of the insulating layer having the DBR structure is disposed on a same vertical plane with the lateral surface of the light emitting structure and the outer lateral surface of the support member, and
wherein light generated from the light emitting structure and light reflected by the DBR structure is emitted to an outside of the phosphor layer through the second surface of the substrate.

19. The light emitting device of claim 1, wherein the outer lateral surface of the insulating layer having the DBR structure is disposed on a same vertical plane with the lateral surface of the light emitting structure and the outer lateral surface of the support member, and
wherein an upper portion of the first region contacts the insulating layer.

20. The light emitting device of claim 1, comprising a first bonding layer including a plurality of metal layers between the first electrode and the first connection electrode;
a second bonding layer including a plurality of metal layers between the second electrode and the second connection electrode; and
a diffusion barrier layer between the reflective layer and the insulating layer.

* * * * *